(12) United States Patent (10) Patent No.: US 12,295,195 B2
Kim et al. (45) Date of Patent: May 6, 2025

(54) LIGHT EMITTING DEVICE PACKAGE WITH RELIABLY FORMED SWITCHING UNIT

(71) Applicant: SAMSUNG ELECTRONICS CO., LTD., Suwon-si (KR)

(72) Inventors: Joo-sung Kim, Seongnam-si (KR); Jong-uk Seo, Hwaseong-si (KR); Dong-gun Lee, Hwaseong-si (KR); Young-jo Tak, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 531 days.

(21) Appl. No.: 17/565,615

(22) Filed: Dec. 30, 2021

(65) Prior Publication Data

US 2022/0123047 A1 Apr. 21, 2022

Related U.S. Application Data

(63) Continuation of application No. 16/244,882, filed on Jan. 10, 2019, now Pat. No. 11,217,623.

(30) Foreign Application Priority Data

Jul. 17, 2018 (KR) .......................... 10-2018-0083135

(51) Int. Cl.
*H10H 29/14* (2025.01)
*H10H 20/01* (2025.01)
(Continued)

(52) U.S. Cl.
CPC .... *H10H 29/142* (2025.01); *H10H 20/01335* (2025.01); *H10H 20/018* (2025.01);
(Continued)

(58) Field of Classification Search
CPC ... H01L 25/0753; H01L 27/156; H01L 33/50; H01L 33/507–508; H01L 33/12; H01L 33/52; H01L 33/54
See application file for complete search history.

(56) References Cited

U.S. PATENT DOCUMENTS 4,394,674 A 7/1983 Sakuma et al.
6,110,277 A 8/2000 Braun
(Continued)

FOREIGN PATENT DOCUMENTS

CN 107393937 A 11/2017
JP 3753948 B2 3/2006
(Continued)

OTHER PUBLICATIONS

Communication dated Oct. 12, 2022 issued by the Korean Intellectual Property Office in Korean Patent Application No. 10-2018-0083135.
(Continued)

*Primary Examiner* — Steven M Christopher
*Assistant Examiner* — Tyler J Wiegand
(74) *Attorney, Agent, or Firm* — Sughrue Mion, PLLC

(57) ABSTRACT

A light emitting device package includes a cell array having a first surface and a second surface located opposite to the first surface and including, on a portion of a horizontal extension line of the first surface, semiconductor light emitting units each including a first conductivity type semiconductor layer, an active layer, and a second conductivity type semiconductor layer sequentially located on a layer surface including a sidewall of the first conductivity type semiconductor layer; wavelength converting units corresponding respectively to the semiconductor light emitting units and each arranged corresponding to the first conductivity type semiconductor layer; a barrier structure arranged between
(Continued)

the wavelength converting units corresponding to the cell array; and switching units arranged in the barrier structure and electrically connected to the semiconductor light emitting units.

4 Claims, 50 Drawing Sheets

(51) Int. Cl.
    *H10H 20/815* (2025.01)
    *H10H 20/851* (2025.01)
    *H10H 20/853* (2025.01)
    *H10H 20/857* (2025.01)
    *H10H 20/812* (2025.01)
    *H10H 20/825* (2025.01)

(52) U.S. Cl.
    CPC ...... *H10H 20/851* (2025.01); *H10H 20/8515* (2025.01); *H10H 20/853* (2025.01); *H10H 20/857* (2025.01); H10H 20/0361 (2025.01); H10H 20/812 (2025.01); H10H 20/815 (2025.01); H10H 20/825 (2025.01)

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,703,253 B2 | 3/2004 | Koide | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,163,876 B2 | 1/2007 | Nagai et al. | |
| 7,208,725 B2 | 4/2007 | Sherrer et al. | |
| 7,288,758 B2 | 10/2007 | Sherrer et al. | |
| 7,319,044 B2 | 6/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,248 B2 | 8/2010 | Shim et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,899,811 B2 | 12/2014 | Jung | |
| 9,825,016 B1 | 11/2017 | Kim et al. | |
| 9,859,330 B2 | 1/2018 | Von Malm et al. | |
| 2014/0225059 A1 | 8/2014 | Yang et al. | |
| 2017/0092820 A1 | 3/2017 | Kim et al. | |
| 2017/0338210 A1* | 11/2017 | Kim | H01L 27/153 |

FOREIGN PATENT DOCUMENTS

| | | |
|---|---|---|
| JP | 4232326 B2 | 3/2009 |
| JP | 4817673 B2 | 11/2011 |
| KR | 1020120062984 A | 6/2012 |
| KR | 1020130101299 A | 9/2013 |
| KR | 10-2016-0141024 A | 12/2016 |
| KR | 1020170129983 A | 11/2017 |

OTHER PUBLICATIONS

Communication issued Mar. 12, 2025 the China National Intellectual Property Administration in Chinese Patent Application No. 201910231211.9.

Yang, G.F. et al., "InGaN/GaN multiple quantum wells on selectively grown GaN microfacets and the applications for phosphor-free white light-emitting diodes", Reviews in Physics, vol. 1, Nov. 2016, pp. 101-119. (19 pages total).

* cited by examiner

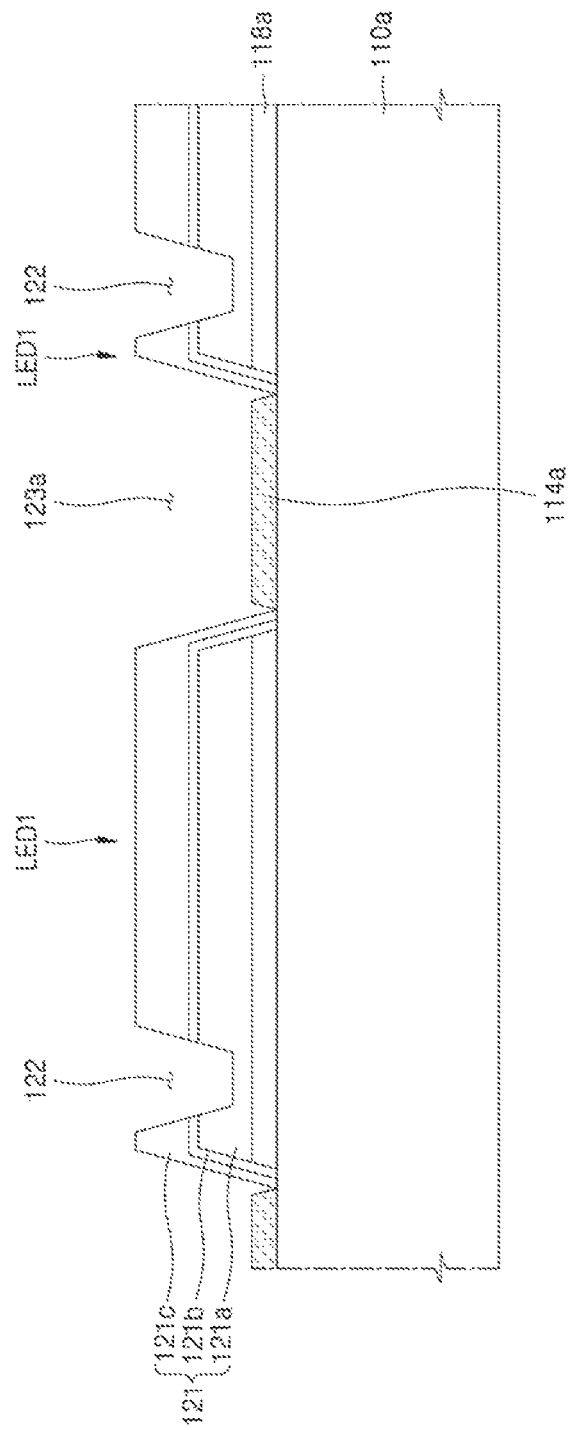

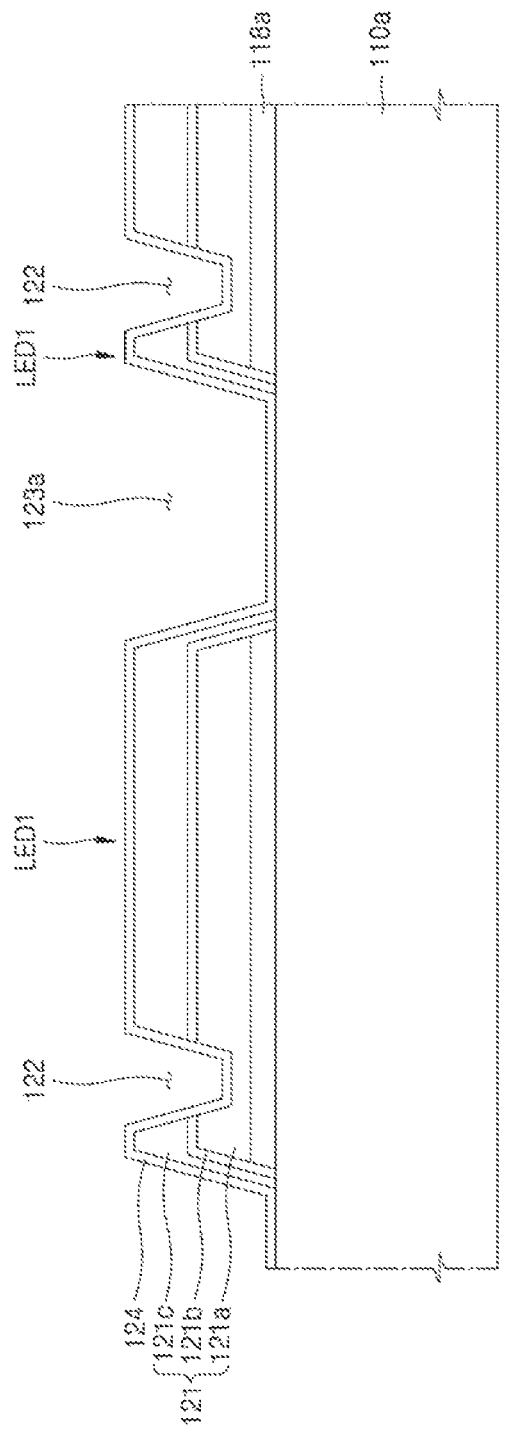

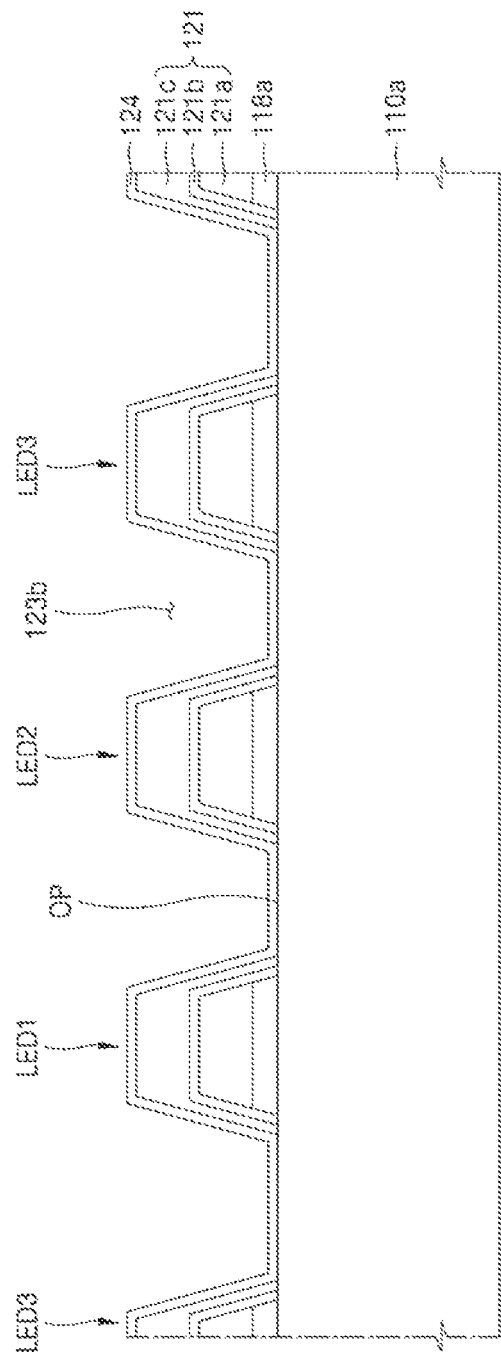

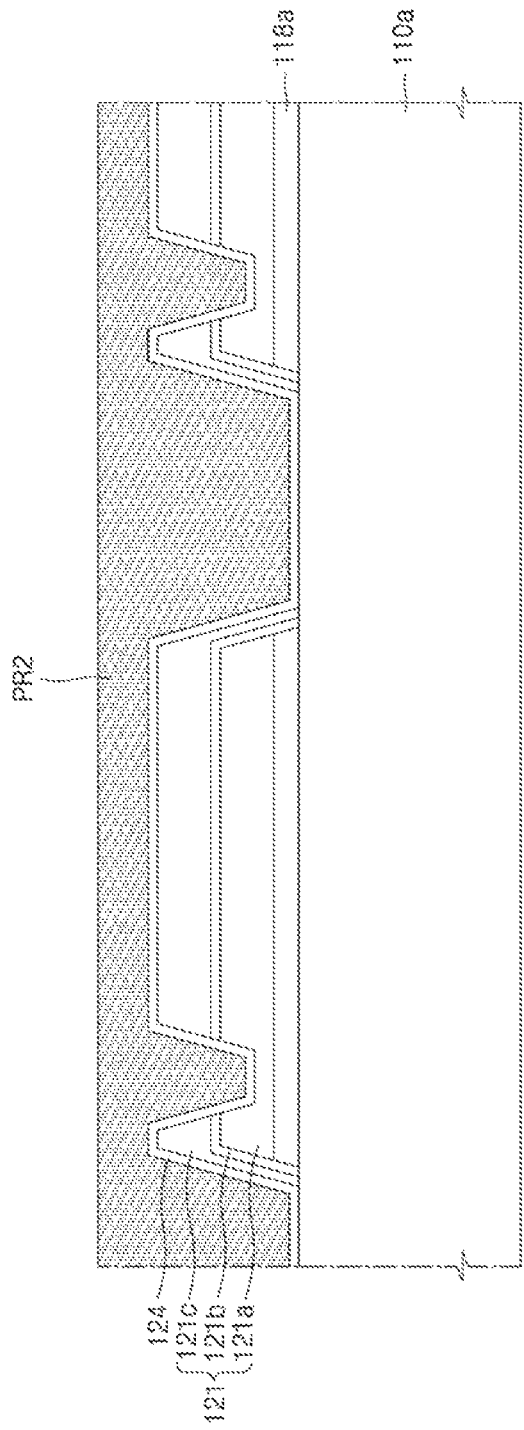

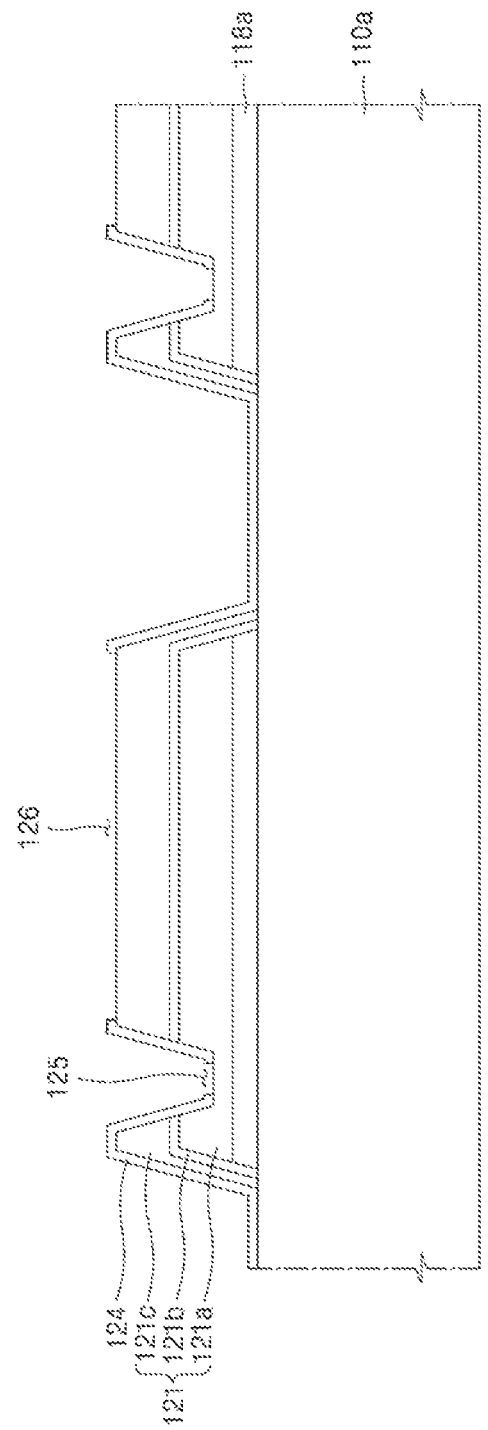

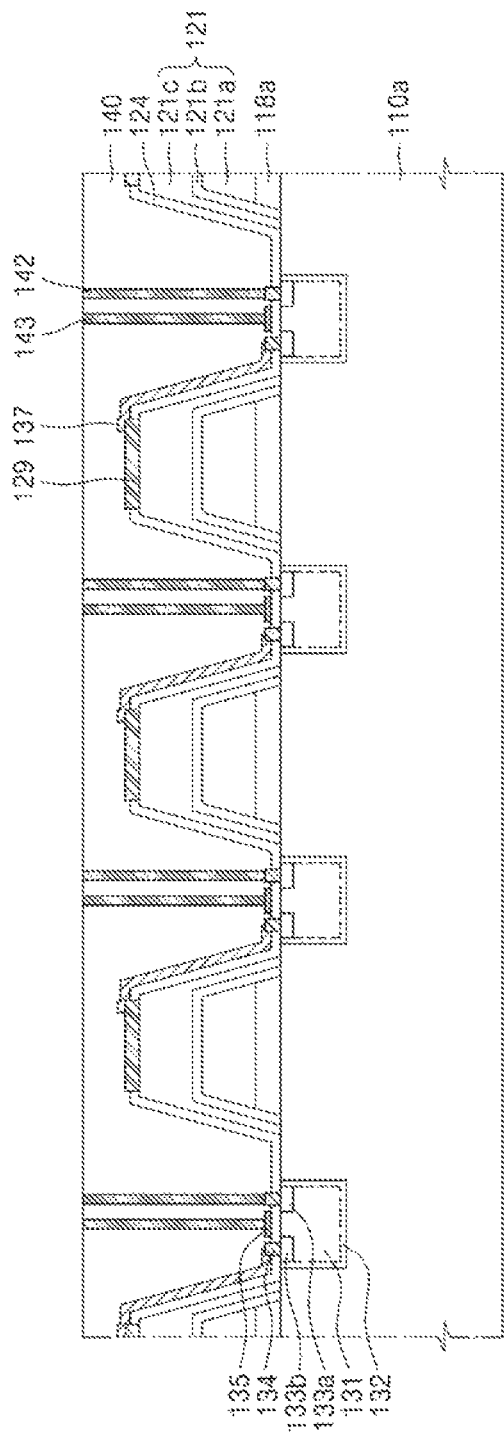

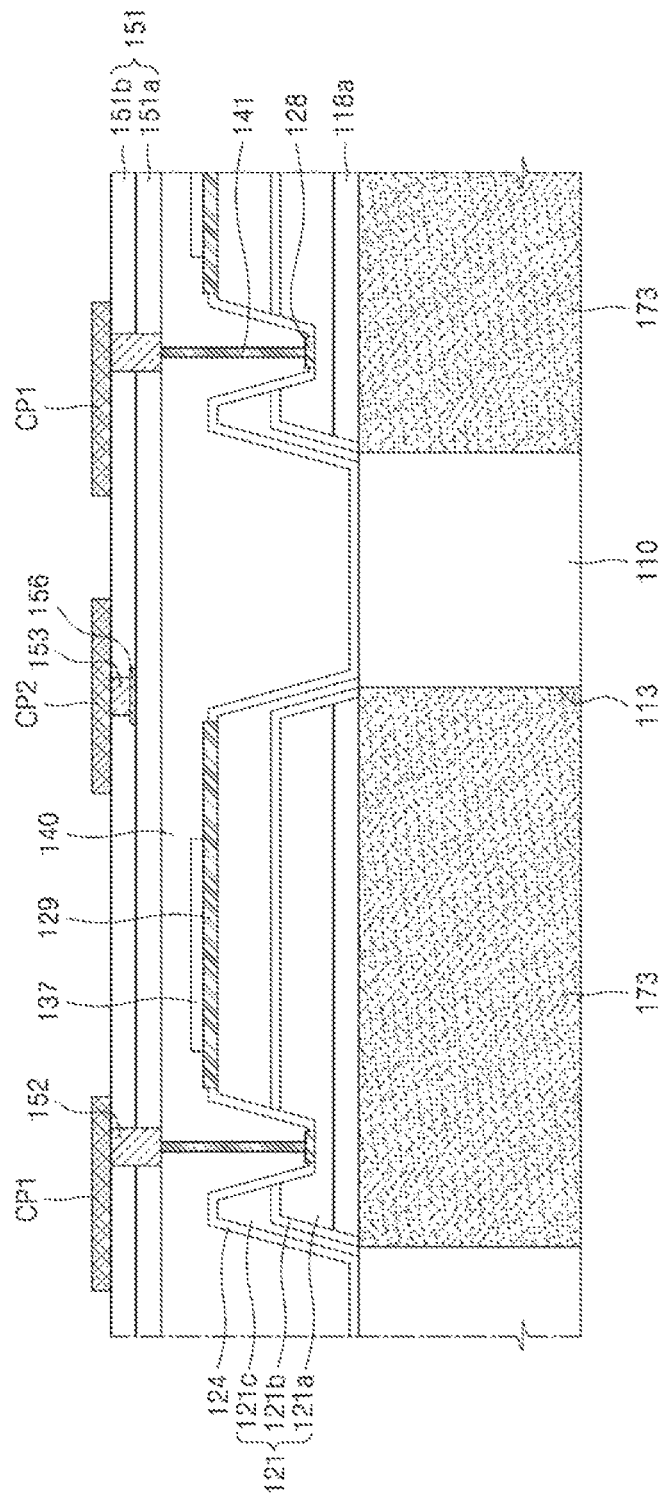

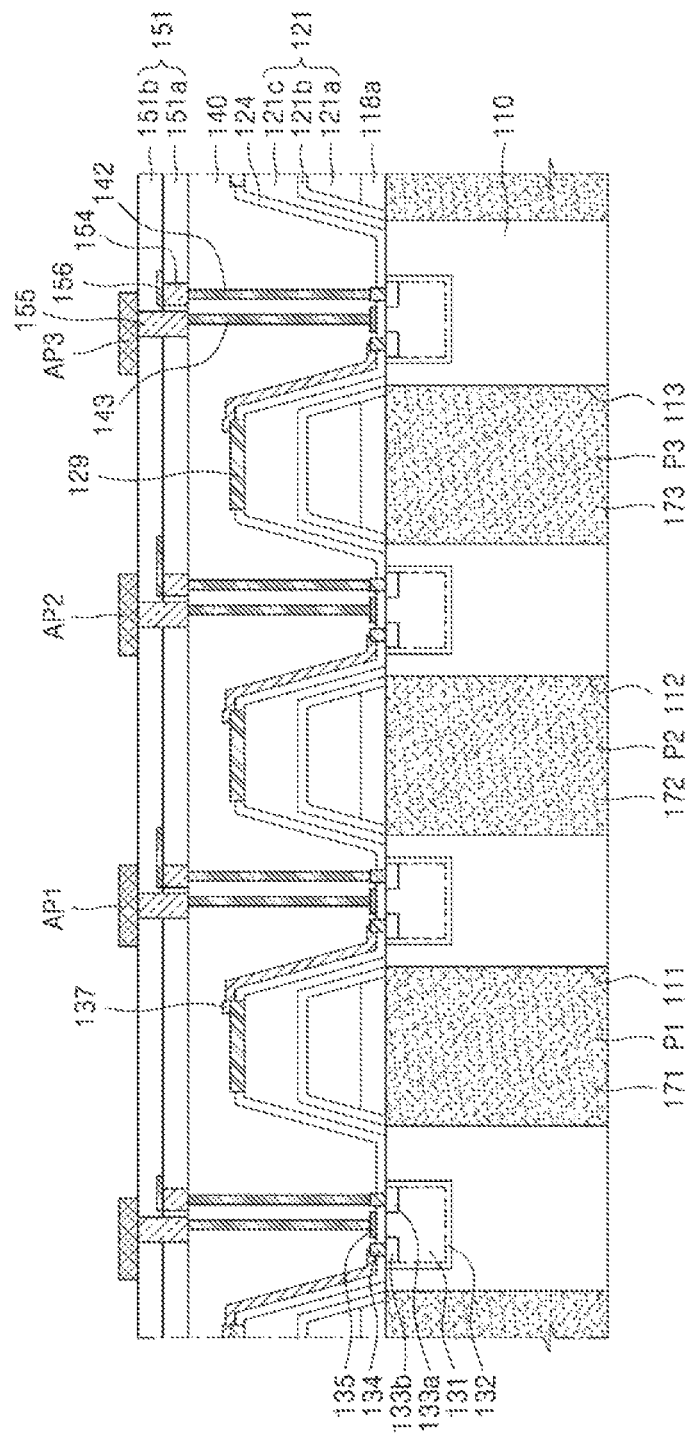

LIGHT EMITTING DEVICE PACKAGE WITH RELIABLY FORMED SWITCHING UNIT

CROSS-REFERENCE TO RELATED APPLICATION

This application is a Continuation application of U.S. application Ser. No. 16/244,882, filed on Jan. 10, 2019, which claims priority from Korean Patent Application No. 10-2018-0083135, filed on Jul. 17, 2018, in the Korean Intellectual Property Office, the disclosure of which is incorporated by reference herein in its entirety.

BACKGROUND

1. Field

Apparatuses, devices, and articles of manufacture consistent with the present disclosure relate to a light emitting device package, and more particularly, to a high-quality light emitting device package.

2. Description of the Related Art

A display apparatus is being developed in such a form that a light emitting device package is used as one pixel as it is. The display apparatus using the light emitting device package may implement high brightness and may freely change an aspect ratio of a screen and implement a large area. The display apparatus using the light emitting device package is required to be easily manufactured and of high quality.

SUMMARY

It is an aspect to provide a high-quality light emitting device package by reliably forming a switching unit for controlling a semiconductor light emitting unit.

According to an aspect of an example embodiment, there is provided a light emitting device package including a cell array having a first surface and a second surface located opposite to the first surface and comprising, on at least a portion of a horizontal extension line of the first surface, a plurality of semiconductor light emitting units each comprising a first conductivity type semiconductor layer, an active layer, and a second conductivity type semiconductor layer sequentially located on a layer surface including a sidewall of the first conductivity type semiconductor layer; a plurality of wavelength converting units corresponding respectively to the plurality of semiconductor light emitting units and each arranged corresponding to the first conductivity type semiconductor layer; a barrier structure arranged between the plurality of wavelength converting units corresponding to the cell array; and a plurality of switching units arranged in the barrier structure and electrically connected to the plurality of semiconductor light emitting units.

According to another aspect of an example embodiment, there is provided a light emitting device package including a substrate having a first surface and a second surface located opposite to the first surface; a plurality of semiconductor light emitting units arranged spaced apart from each other on at least a portion of a horizontal extension line of the first surface of the substrate and each comprising a first conductivity type semiconductor layer, an active layer, and a second conductivity type semiconductor layer sequentially located on the first conductivity type semiconductor layer; a plurality of wavelength converting units corresponding respectively to the plurality of semiconductor light emitting units and arranged on the first conductivity type semiconductor layers of the plurality of semiconductor light emitting units; a plurality of switching units arranged spaced apart from the plurality of semiconductor light emitting units over the first surface of the substrate and electrically connected to the plurality of semiconductor light emitting units; and a recess portion having a step at the first surface of the substrate where each of the plurality of switching units is located.

According to another aspect of an example embodiment, there is provided a light emitting device package including a substrate having a first surface and a second surface located opposite to the first surface; a plurality of semiconductor light emitting units arranged spaced apart from each other on at least a portion of a horizontal extension line of the first surface of the substrate and each comprising a first conductivity type semiconductor layer, an active layer, and a second conductivity type semiconductor layer sequentially located on a layer surface including a sidewall of the first conductivity type semiconductor layer; a plurality of wavelength converting units corresponding respectively to the plurality of semiconductor light emitting units and arranged corresponding to the first conductivity type semiconductor layers of the plurality of semiconductor light emitting units; and a plurality of switching units arranged spaced apart from the plurality of semiconductor light emitting and electrically connected to the plurality of semiconductor light emitting units, wherein the sidewall of the first conductivity type semiconductor layer forms an inclination angle with respect to the first surface of the substrate, and a first thickness of at least one of the active layer and the second conductivity type semiconductor layer arranged along the sidewall is less than a second thickness of the active layer and the second conductivity type semiconductor layer stacked on the layer surface of the first conductivity type semiconductor layer.

BRIEF DESCRIPTION OF THE DRAWINGS

Example embodiments will be more clearly understood from the following detailed description taken in conjunction with the accompanying drawings in which:

FIGS. 15A to 23B are cross-sectional views illustrating a method of manufacturing a light emitting device package according to an embodiment;

DETAILED DESCRIPTION

Figure 1:
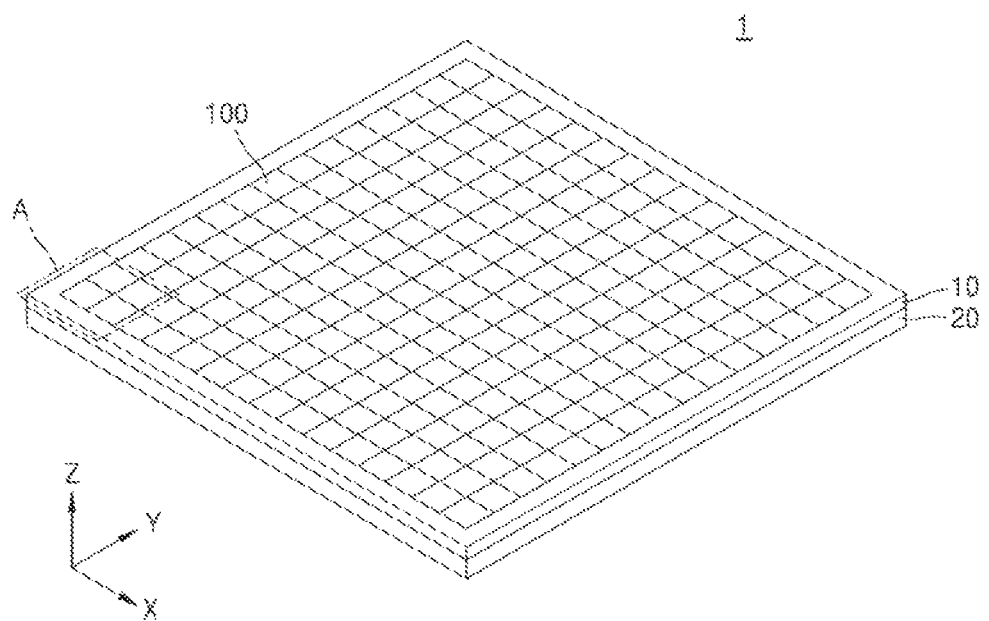
FIG. 1 is a perspective view schematically illustrating a display apparatus including a light emitting device package according to an embodiment.

Hereinafter, example embodiments will be described in detail with reference to the accompanying drawings. The following embodiments may be implemented alone or in combination. Thus, the scope of the inventive concept is not limited to only one embodiment.

The accompanying drawings are not necessarily drawn to scale, and in some illustrations, proportions of at least some of the structures illustrated in the drawings may be exaggerated to clearly illustrate the features of embodiments. In the present specification, the phrase "at least one of A and B" includes within its scope "only A", "only B", and "both A and B".

In the detailed description, for the sake of convenience, terms such as first and second are used to describe various elements, components, and/or sections (or regions), but these elements, components, and/or sections (or regions) are not limited by these terms. These terms are only used to distinguish one element, component, or section from another element, component, or section. Also, in the detailed description, the first and second components are described separately for convenience of description and thus may not directly correspond to the first and second components of the claims. Also, in the detailed description, terms such as top, bottom, side, on, over, above, beneath, under, and below are based on the drawings and may actually vary depending on the directions in which the elements are arranged.

FIG. 1 is a perspective view schematically illustrating a display apparatus including a light emitting device package according to an embodiment.

Particularly, a display apparatus (or display panel) 1 may include a circuit board 20 and a light emitting device module 10 located on the circuit board 20. The light emitting device module 10 may include a plurality of light emitting device packages 100 that may selectively emit light of red (R), green (G), and blue (B).

Each of the plurality of light emitting device packages 100 may constitute one pixel of the display apparatus 1. The plurality of light emitting device packages 100 may be arranged on the circuit board 20 in rows and columns. In other words, the plurality of light emitting device packages 100 may be arranged on the circuit board 20 in X and Y directions. In FIG. 1, a Z direction may represent a direction perpendicular to the X and Y directions.

In an embodiment, the display apparatus 1 is illustrated as including an arrangement of 15×15 light emitting device packages 100; however, this is merely for convenience of description. In practice, the display apparatus 1 may include an arrangement of a greater number of (e.g., 1,024×768) light emitting device packages 100 according to the resolution. That is, the number of light emitting device packages 100 is not particularly limited.

The light emitting device package 100 may include subpixels (SP1 to SP3 of FIGS. 3 to 6) corresponding to a light source of RGB (Red-Green-Blue), and the subpixels may be arranged spaced apart from each other. This arrangement will be described in detail with reference to FIGS. 3 to 6. The colors of the subpixels are not limited to RGB, and a light source of CYMK (Cyan, Yellow, Magenta, and Black) may also be used.

Figure 13:
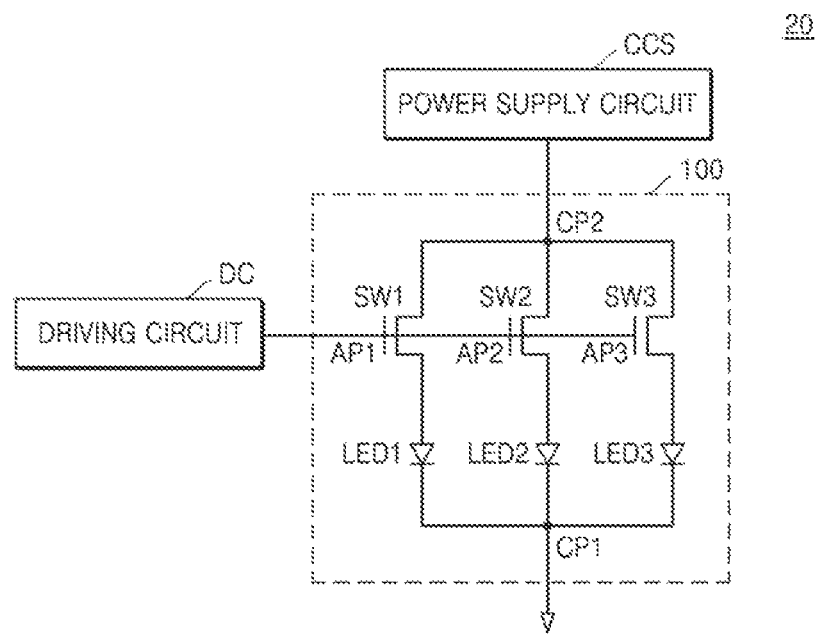
FIGS. 13 and 14 are circuit diagrams of a light emitting device package according to an embodiment.

As illustrated in FIG. 13, the circuit board 20 may include a power supply circuit CCS configured to supply power to each light emitting device package 100 of the light emitting device module 10 and a driving circuit DC configured to drive the light emitting device package 100.

Figure 2:
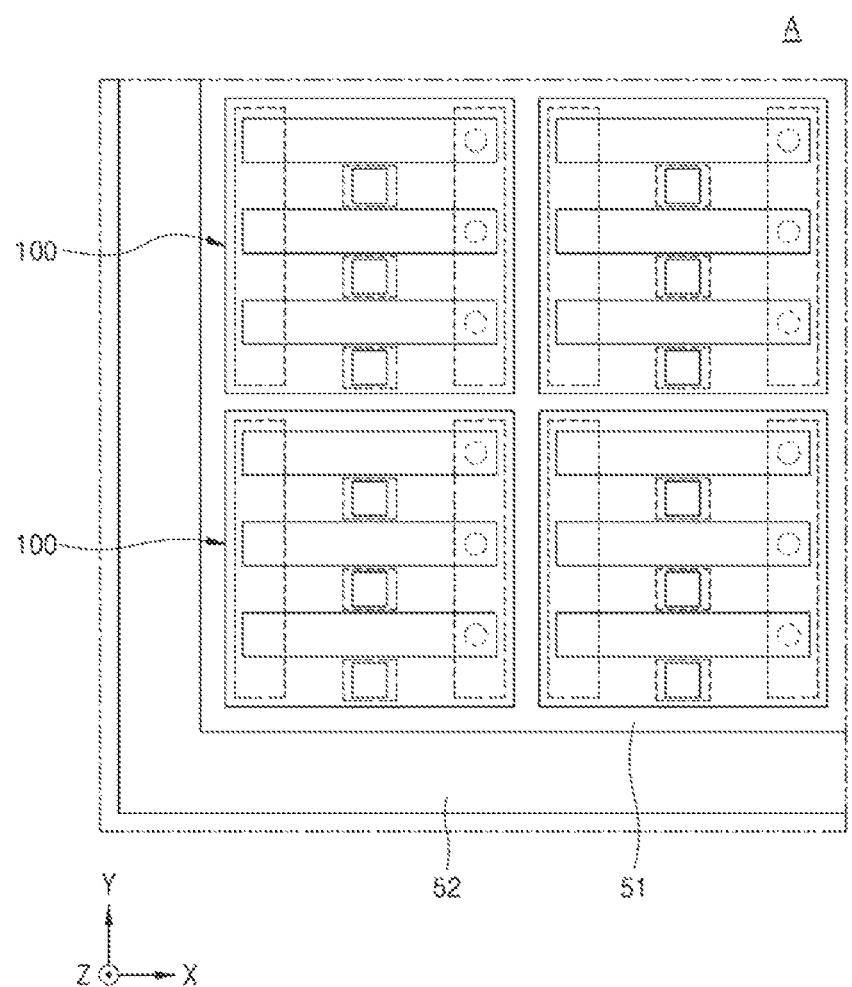
FIG. 2 is an enlarged plan view of a portion A of a light emitting device module of the display apparatus illustrated in FIG. 1.
Figure 3:
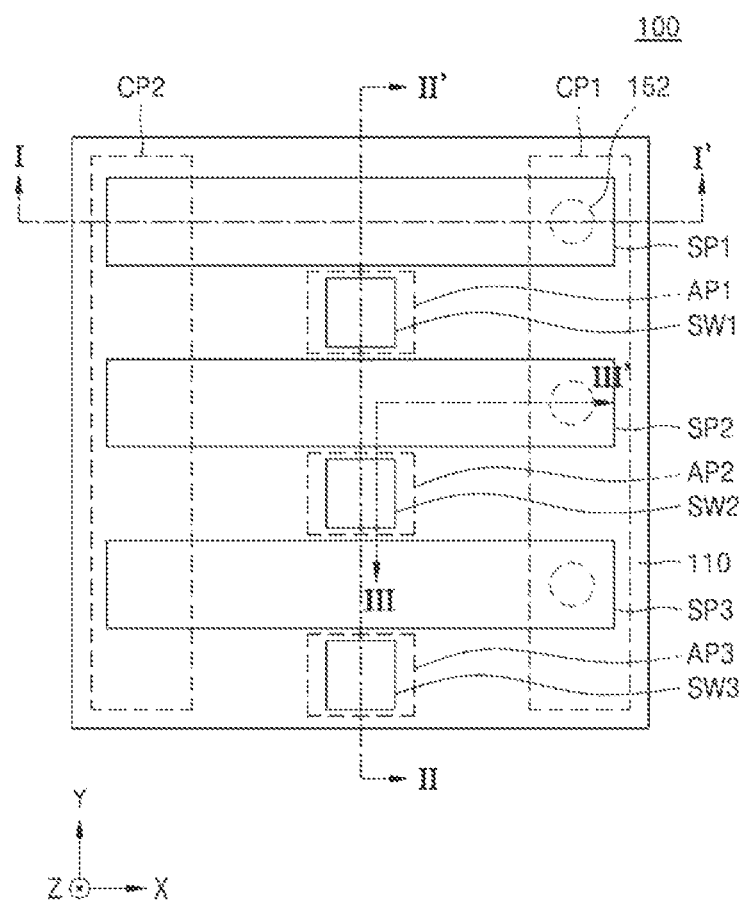
FIGS. 3 and 4 respectively are a plan view and a rear view of a light emitting device package of FIG. 2.
Figure 4:
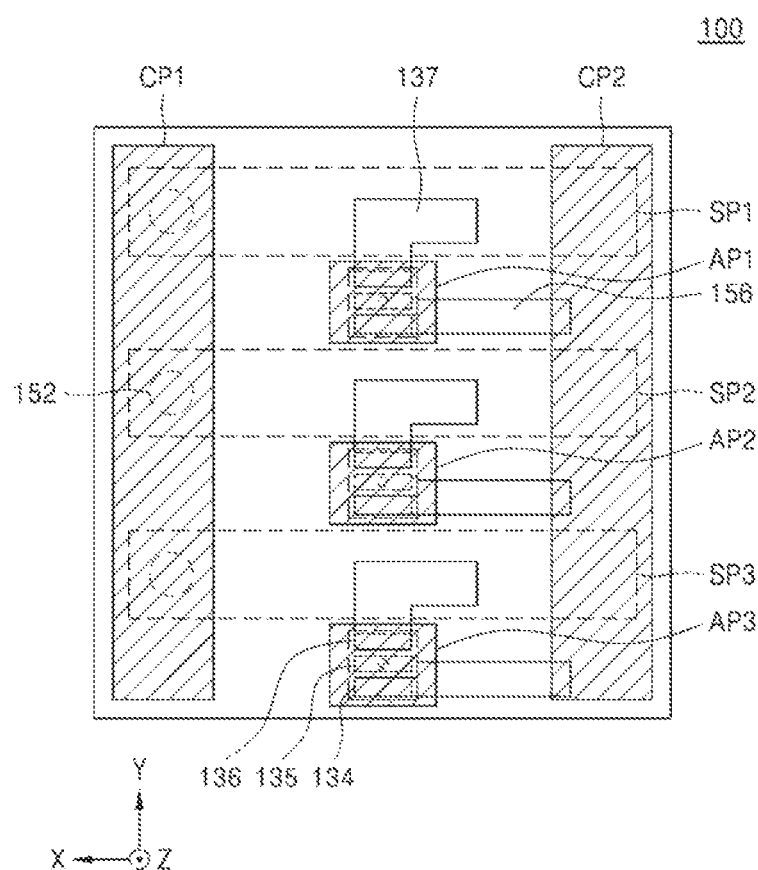

FIG. 2 is an enlarged plan view of a portion A of a light emitting device module of the display apparatus illustrated in FIG. 1. FIGS. 3 and 4 respectively are a plan view and a rear view of a light emitting device package of FIG. 2.

Particularly, as illustrated in FIG. 2, each of the plurality of light emitting device packages 100 may be arranged to be surrounded by a molding unit 51. The molding unit 51 may include a black matrix. Each region surrounded by the molding unit 51 may be provided as an emission region in which each light emitting device package 100 is arranged. An outer region 52 of the molding unit 51 may be a non-emission region. The molding unit 51 may electrically isolate each light emitting device package 100 such that each light emitting device package 100 may be independently driven as one pixel.

As illustrated in FIGS. 3 and 4, each light emitting device package 100 forming one pixel may include a first subpixel SP1, a second subpixel SP3, and a third subpixel SP3. The first to third subpixels SP1 to SP3 may be arranged to be surrounded by a barrier structure 110. In the barrier structure 110, three switching units, i.e., a first switching unit SW1, a second switching unit SW2, and a third switching unit SW3, may be arranged to control the subpixels SP1 to SP3, respectively. In an embodiment, three subpixels SP1 to SP3 and three switching units SW1 to SW3 are arranged in one light emitting device package 100; however, this is merely for convenience of description and two subpixels and two switching units may be arranged therein. That is, the number of subpixels and the number of switching units is not particularly limited.

In an embodiment, the subpixels SP1 to SP3 may extend in one direction, that is, for example the X direction, and may be arranged spaced apart from each other in another direction, for example the Y direction. In an embodiment, the switching units SW1 to SW3 are arranged between the subpixels SP1 to SP3 to be spaced apart from each other in the Y direction; however, this is merely an example. For example, the switching units SW1 to SW3 may be arranged on one side of the subpixels SP1 to SP3 to be spaced apart from each other. The switching units SW1 to SW3 may be arranged at any positions as long as they are installed in the barrier structure 110.

Two common electrode pads, i.e., a first common electrode pad CP1 and a second common electrode pad CP2, and three individual electrode pads, i.e., a first individual electrode pad AP1, a second individual electrode pad AP2, and a third individual electrode pad AP3, may be provided on a bottom surface of the light emitting device package 100. In an embodiment, the common electrode pads CP1 and CP2 are arranged in parallel in the Y direction; however, the inventive concept is not limited thereto. In an embodiment, the individual electrode pads AP1 to AP3 are arranged in the Y direction; however, the inventive concept is not limited thereto. In an embodiment, the individual electrode pads AP1 to AP3 are arranged along a line that extends in the Y direction; however, the inventive concept is not limited thereto. The common electrode pad CP1 may be electrically connected to the subpixels SP1 to SP3 through a through electrode 152.

As illustrated in FIG. 4, the light emitting device package 100 may include a source electrode 136, a drain electrode 134, and a gate electrode 135, which will be described below in detail. In an embodiment, a source electrode 136, a drain electrode 134, and a gate electrode 135 may be arranged for each of the subpixels SP1 to SP3 as shown in FIG. 4. The source electrodes 136 may be electrically connected to the subpixels SP1 to SP3, respectively, by a connection electrode 137. The drain electrodes 134 may be electrically connected to the common electrode pad CP2 by a line 156, respectively provided for each drain electrode 134. The gate electrodes 135 may be electrically connected to the individual electrode pads AP1 to AP3.

Figure 5:
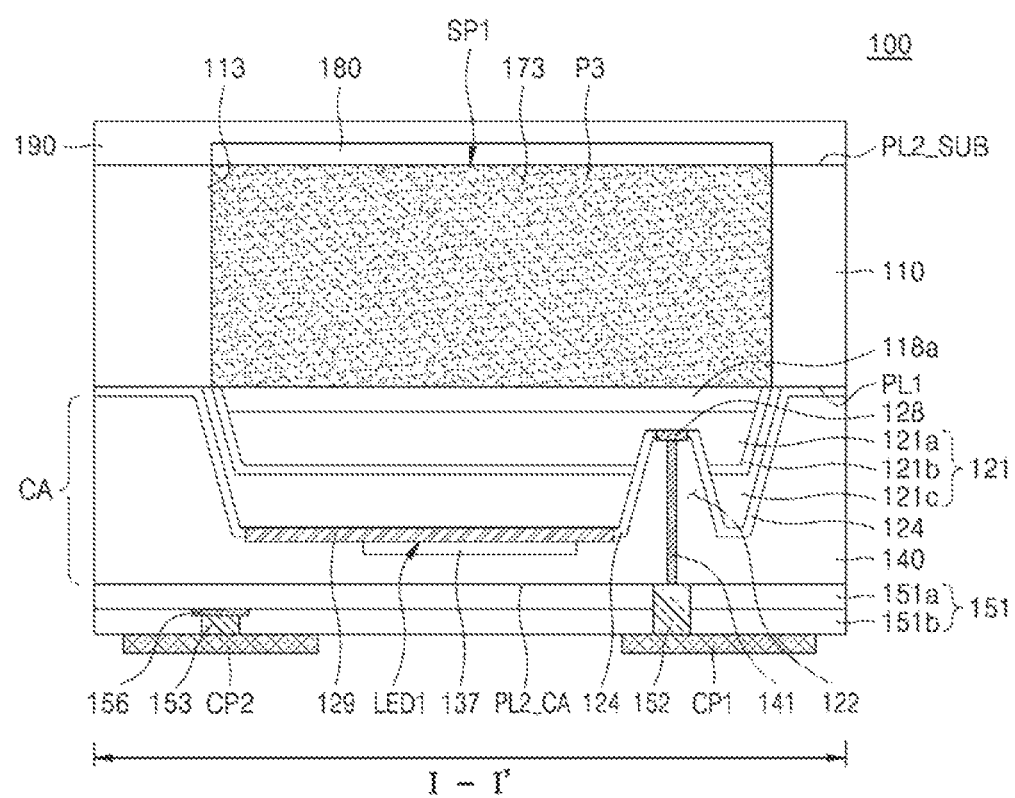
FIG. 5 is a cross-sectional view taken along line I-I' of FIG. 3.
Figure 6:
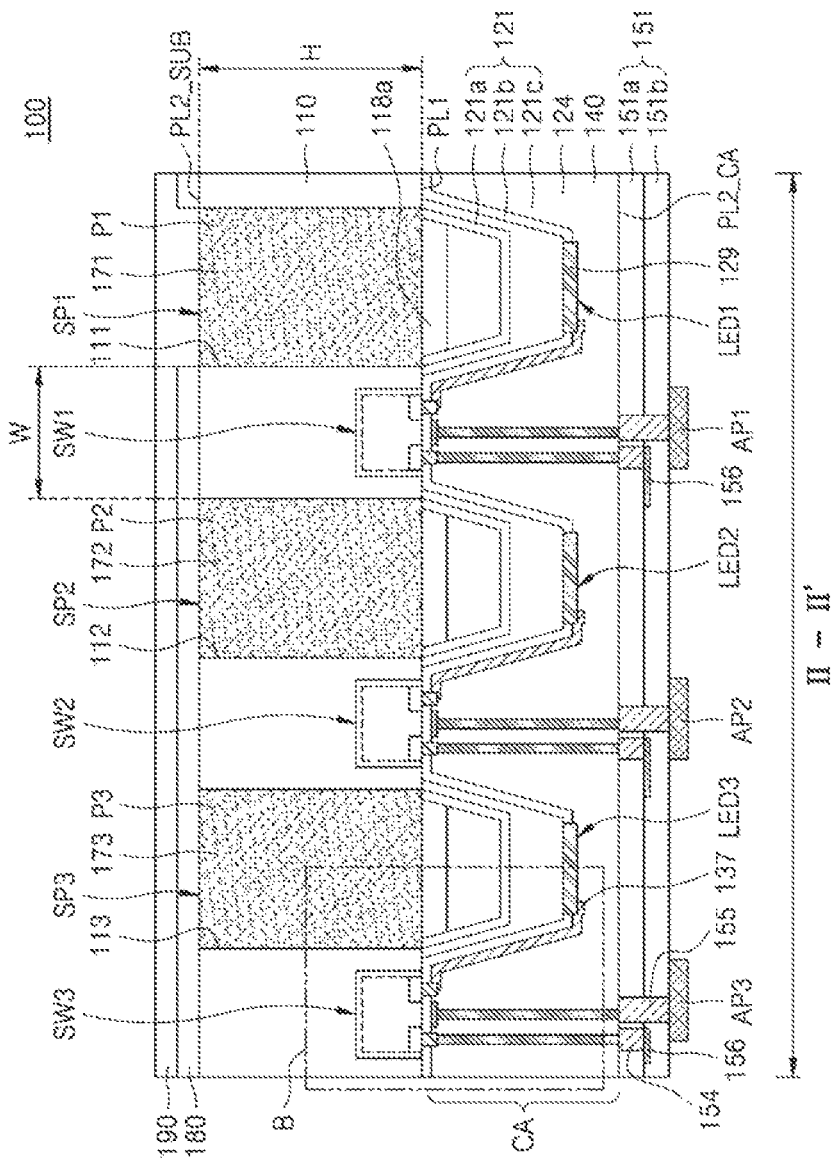
FIG. 6 is a cross-sectional view taken along line II-II' of FIG. 3.
Figure 7:
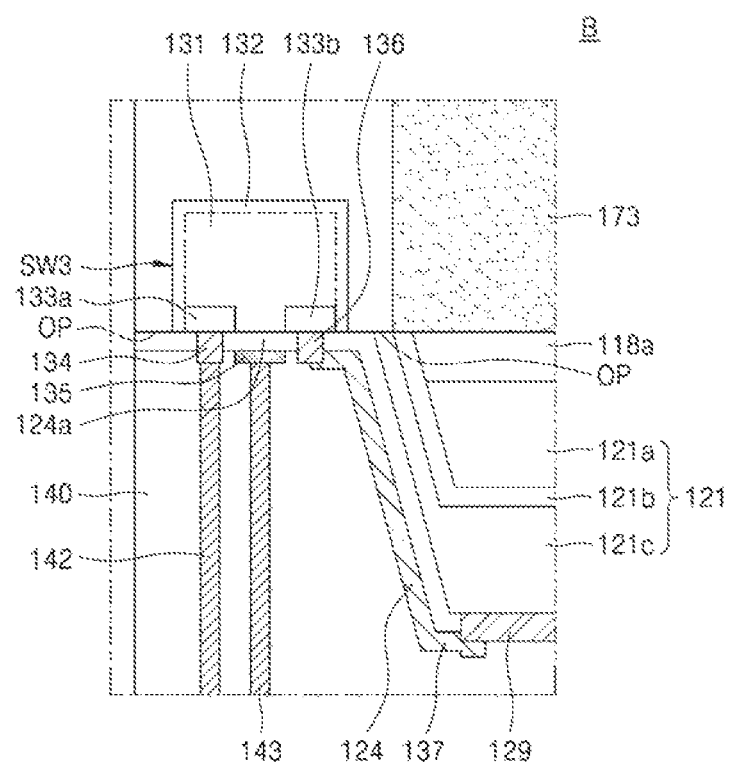
FIG. 7 is an enlarged view of a portion B of FIG. 6.

FIG. 5 is a cross-sectional view taken along line I-I' of FIG. 3. FIG. 6 is a cross-sectional view taken along line II-II' of FIG. 3. FIG. 7 is an enlarged view of a portion B of FIG. 6.

Particularly, the light emitting device package 100 may include a cell array CA including a first semiconductor light emitting unit LED1, a second semiconductor light emitting unit LED2, and a third semiconductor light emitting unit LED3 (or first to third light emitting diodes), a first wavelength converting unit 171, a second wavelength converting unit 172, and a third wavelength converting unit 173 (or first to third wavelength converting structures) arranged corresponding respectively to the first to third semiconductor light emitting units LED1 to LED3, a barrier structure 110 arranged to isolate the first to third wavelength converting units 171 to 173 from each other, and a first switching unit SW1, a second switching unit SW2, and a third switching unit SW3 arranged in the barrier structure 110.

The cell array CA may have a first surface PL1 and a second surface PL2_CA facing each other. That is, the first surface PL1 and the second surface PL2_CA may be on opposite sides of the cell array CA as shown in FIGS. 5-6. The second surface PL2_CA may be located opposite to the first surface PL1. In FIGS. 5 to 7, for the sake of convenience, the lower portion of the drawings may be referred to as the upper portion thereof and the upper portion of the drawings may be referred to as the lower portion thereof. The first to third semiconductor light emitting units LED1 to LED3 may be arranged over the first surface PL1 of the cell array CA with a buffer layer 118a therebetween. That is, in an embodiment, the buffer layer 118a may be between the first surface PL1 and each of the first to third semiconductor light emitting units LED1 to LED3, as shown in FIG. 6. The first to third wavelength converting units 171 to 173 may be arranged under the first surface PL1 to correspond to the first to third semiconductor light emitting units LED1 to LED3, respectively. In other words, the buffer layer 118a may be formed over the first surface PL1 between the first to third semiconductor light emitting units LED1 to LED3 and the first to third wavelength converting units 171 to 173.

The first to third semiconductor light emitting units LED1 to LED3 may emit the same light or different lights. In an embodiment, the first to third semiconductor light emitting units LED1 to LED3 may emit blue light (e.g., 440 nm to 460 nm) or ultraviolet light (e.g., 380 nm to 440 nm). In an embodiment, the first to third semiconductor light emitting units LED1 to LED3 may emit red, green, and blue lights, respectively.

Each of the first to third semiconductor light emitting units LED1 to LED3 may include a light emitting structure 121 including a first conductivity type semiconductor layer 121a, a second conductivity type semiconductor layer 121c, and an active layer 121b located therebetween. One sidewall of the light emitting structure 121 may be formed to be inclined. The active layer 121b and the second conductivity type semiconductor layer 121c may be arranged on the surface and sidewall of the first conductivity type semiconductor layer 121a of the first to third semiconductor light emitting units LED1 to LED3.

When the first conductivity type semiconductor layer 121a is formed and then the active layer 121b and the second conductivity type semiconductor layer 121c are formed as described below, the active layer 121b and the second conductivity type semiconductor layer 121c may be formed on the surface and sidewall of the first conductivity type semiconductor layer 121a. The first conductivity type semiconductor layer 121a and the second conductivity type semiconductor layer 121c may include an N-type semiconductor layer and a P-type semiconductor layer, respectively. For example, the first conductivity type semiconductor layer 121a and the second conductivity type semiconductor layer 121c may include a nitride semiconductor of $Al_xIn_yGa_{1-x-y}N$ ($0 \leq x \leq 1$, $0 \leq y \leq 1$, $0 \leq x+y \leq 1$); however, they are not limited thereto and may also include a GaAs-based semiconductor or a GaP-based semiconductor.

The active layer 121b may include a multiple quantum well (MQW) structure in which quantum well layers and quantum barrier layers are alternately stacked. For example, the active layer 121b may include a nitride-based MQW such as InGaN/GaN or GaN/AlGaN; however, the active layer 121b is not limited thereto and may include another semiconductor such as GaAs/AlGaAs, InGaP/GaP, or GaP/AlGaP.

The active layers 121b of the first to third semiconductor light emitting units LED1 to LED3 may be configured to emit lights of different wavelengths. In an embodiment, the active layers 121b of the first to third semiconductor light emitting units LED1 to LED3 may be configured to emit lights of different colors. In an embodiment, the active layers 121b of the first to third semiconductor light emitting units LED1 to LED3 may be configured to emit lights of the same color. For example, the active layers 121b may emit red, green, and blue lights, respectively, and may emit the same blue or ultraviolet light.

A first electrode 128 and a second electrode 129 may be electrically connected to the first conductivity type semiconductor layer 121a and the second conductivity type semiconductor layer 121c, respectively. The first electrode 128 and the second electrode 129 may be arranged on a mesa-etched region 122 of the first conductivity type semiconductor layer 121a and the second conductivity type semiconductor layer 121c, respectively.

For example, the first electrode 128 may include at least one of Al, Au, Cr, Ni, Ti, and Sn. The second electrode 129 may be formed of a reflective metal. For example, the second electrode 129 may include a material such as Ag, Ni, Al, Cr, Rh, Pd, Ir, Ru, Mg, Zn, Pt, or Au and may have a single-layer structure or a multi-layer structure.

An insulating layer 124 may be arranged over the surface of the first to third semiconductor light emitting units LED1 to LED3 and the first surface PL1 of the cell array CA. A region where the first electrode 128 and the second electrode 129 of the first to third semiconductor light emitting units LED1 to LED3 are arranged may be defined by the insulating layer 124. The insulating layer 124 arranged over the first surface PL1 of the cell array CA may define a region where the source electrode 136 and the drain electrode 134 of the first to third switching units SW1 to SW3 are arranged.

As illustrated in FIG. 7, a gate insulating layer 124a arranged between the source electrode 136 and the drain electrode 134 may be used as a gate insulating layer of the first to third switching units SW1 to SW3. As illustrated in FIGS. 5 and 6, the cell array CA may include a molding unit 140 covering the first to third semiconductor light emitting units LED1 to LED3 and forming the second surface PL2_CA of the cell array CA. The molding unit 140 of FIGS. 5 and 6 may correspond to the molding unit 51 of FIG. 2.

The molding unit 140 may be configured to expose first to third conductive vias 141 to 143 to the second surface PL2_CA. The first to third conductive vias 141 to 143 are connected to the first to third semiconductor light emitting units LED1 to LED3 and the first to third switching units SW1 to SW3, as shown in FIGS. 5-7. The molding unit 140 may have a high Young's modulus in order to firmly support the first to third semiconductor light emitting units LED1 to LED3. The molding unit 140 may include a material having a high thermal conductivity in order to effectively dissipate the heat generated from the first to third semiconductor light emitting units LED1 to LED3.

For example, the molding unit 140 may be formed of a material including an epoxy resin or a silicone resin. The molding unit 140 may include light reflective particles for reflecting light. Titanium dioxide ($TiO_2$) or aluminum oxide ($Al_2O_3$) may be used as the light reflective particles, but the inventive concept is not limited thereto.

A circuit board 151 may be arranged on the second surface PL2_CA of the cell array CA to connect the first to third conductive vias 141 to 143 to the common electrode pads CP1 and CP2 and the individual electrode pads AP1 to AP3. The circuit board 151 may correspond to the circuit board 20 of FIG. 1. The circuit board 151 may include a plurality of printed circuit boards 151a and 151b, and the plurality of printed circuit boards 151a and 151b may include through electrodes 152, 153, 154, and 155 and the line 156. The common electrode pads CP1 and CP2 and the individual electrode pads AP1 to AP3 may be arranged on one surface of the circuit board 151.

The first to third wavelength converting units 171 to 173 may be arranged under the first surface PL1 of the cell array CA to be isolated from each other by the barrier structure 110. The first to third switching units SW1 to SW3 may be arranged in the barrier structure 110. The barrier structure 110 may be arranged to contact the lower portion of the first surface PL1 of the cell array CA.

The barrier structure 110 may have a height H and a width W, as shown in FIG. 6. The height H of the barrier structure 110 may be suitably selected in the range of about 1 μm to about 50 μm. When the height H of the barrier structure 110 is greater than 50 μm, the light extraction efficiency thereof may decrease. In an embodiment, the height H of the barrier structure 110 may be set such that the first to third switching units SW1 to SW3 may be arranged therein and may be set to 35 μm or less.

The width W of the barrier structure 110 may be suitably selected in the range of about 1 μm to about 100 μm. When the width W of the barrier structure 110 is greater than 100 μm, the distance between the subpixels SP1 to SP3 may increase and thus the resolution of a display may decrease. In an embodiment, the width W of the barrier structure 110 may be set such that the first to third switching units SW1 to SW3 may be arranged therein and may be set to 50 μm or less.

The barrier structure 110 may have a first light emitting window 111, a second light emitting window 112, and a third light emitting window 113 at positions corresponding to the first to third semiconductor light emitting units LED1 to LED3, respectively. The light emitting windows 111 to 113 may be through holes that extend from a first surface PL1 to a second surface PL2_SUB of a substrate 110a (see FIGS. 15A to 21B).

The first to third light emitting windows 111 to 113 may be provided as spaces for forming the first to third wavelength converting units 171 to 173, respectively. In other words, wavelength converting materials may be charged in the through holes 111 to 113 to constitute the first to third wavelength converting units 171 to 173.

The barrier structure 110 may include a substrate 110a (see FIGS. 15A to 21B) for growing the first to third semiconductor light emitting units LED1 to LED3. The substrate may have a first surface PL1 and a second surface PL2_SUB located opposite to the first surface PL1. That is, the first surface PL1 and the second surface PL2_SUB may be on opposite sides of the substrate. The substrate and the cell array CA may have the same first surface PL1. The substrate may include a semiconductor substrate including silicon. The substrate and the first to third wavelength converting units 171 to 173 may have the same second surface PL2_SUB.

The barrier structure 110 may include a semiconductor substrate that may be implanted with impurities to form the first to third switching units SW1 to SW3. For example, the barrier structure 110 may include a Group IV semiconductor substrate or a Group III-IV compound semiconductor substrate. The barrier structure 110 may include, for example, a Si substrate, a SiC substrate, or a SiGe substrate.

The barrier structure 110 may be arranged to surround the side surfaces of the first to third wavelength converting units 171 to 173 to isolate the first to third wavelength converting units 171 to 173 from each other. The barrier structure 110 and the molding unit 140 may effectively block the interference between the lights emitted from the first to third semiconductor light emitting units LED1 to LED3.

The first to third wavelength converting units 171 to 173 may adjust and convert the lights emitted from the first to third semiconductor light emitting units LED1 to LED3 into lights of different colors. In an embodiment, the first to third wavelength converting units 171 to 173 may be configured to provide blue, green, and red lights, respectively. In an embodiment, when the first to third semiconductor light emitting units LED1 to LED3 emit blue light, the second and third wavelength converting units 172 and 173 may include green and red phosphors P2 and P3, respectively. The second and third wavelength converting units 172 and 173 may be formed by dispensing light-transmissive liquid resins mixed with wavelength converting materials such as green and red phosphors P2 and P3 to the second and third light emitting windows 112 and 113.

In an embodiment, the second and third wavelength converting units 172 and 173 may further include an optical filter layer 180 for selectively blocking blue light. By using the optical filter layer 180, the second and third light emitting windows 112 and 113 may provide only desired green and red lights.

In an embodiment, when the first to third semiconductor light emitting units (LED1 to LED3) emit blue light, the first wavelength converting unit 171 may not include a phosphor, i.e., a phosphor may be omitted from the first wavelength converting unit 171. Thus, the first wavelength converting unit 171 may provide the same blue light as the blue light emitted from the first semiconductor light emitting unit LED1. The first wavelength converting unit 171 may be formed by dispensing a light-transmissive liquid resin having no phosphor mixed therein. In an embodiment, the first wavelength converting unit 171 may include a blue or cyan (e.g., about 480 nm to about 520 nm) phosphor P1 for adjusting the color coordinates of blue light. Since the phosphor P1 is used to adjust the color coordinates of blue light to be provided by the first wavelength converting unit 171, the phosphor P1 may be mixed less than the phosphors P2 and P3 mixed in the second and third wavelength converting units 172 and 173 for conversion into other colors.

As illustrated in FIGS. 5 and 6, an encapsulation unit 190 may be arranged on the surfaces of the first to third wavelength converting units 171 to 173 to prevent degradation of phosphors. In the barrier structure 110, the first to third switching units SW1 to SW3 may be arranged to selectively drive and control the first to third semiconductor light emitting units LED1 to LED3.

As illustrated in FIGS. 3 and 6, the first to third switching units SW1 to SW3 may be arranged in regions adjacent to the first to third semiconductor light emitting units LED1 to LED3, respectively. The first to third semiconductor light emitting units LED1 to LED3 may be arranged in parallel over the first surface PL1, as shown in FIG. 6. The first to third switching units SW1 to SW3 may be arranged in parallel with the first to third semiconductor light emitting units LED1 to LED3, as shown in FIG. 6. Although FIG. 3 illustrates that the first to third switching units SW1 to SW3 are arranged in one direction (e.g., the Y direction in FIG. 3) of the light emitting device package 100, the inventive concept is not limited thereto and they may be arranged variously at certain positions in the barrier structure 110.

The first to third switching units SW1 to SW3 may be electrically connected to the first to third semiconductor light emitting units LED1 to LED3 to control the first to third semiconductor light emitting units LED1 to LED3. Each of the first to third switching units SW1 to SW3 may include an exposure region OP exposing the first surface PL1 of the cell array CA. The exposure region OP may be a region that is protected by a mask layer to suppress defects or damage in a manufacturing process as described below.

Each of the first to third switching units SW1 to SW3 may be a switching device, for example, a metal oxide silicon field effect transistor (MOSFET). In an embodiment, each of the first to third switching units SW1 to SW3 may be an N-channel MOSFET. The first to third switching units SW1 to SW3 may have the same structure.

Each of the first to third switching units SW1 to SW3 may include a P-well region 131 formed in an N well 132, as illustrated in FIG. 7. A source region 133b and a drain region 133a formed by implanting P-type impurities may be arranged in a certain region of the P-well region 131 of each of the first to third switching units SW1 to SW3. A gate insulating layer 124a may be arranged between the drain region 133a and the source region 133b.

The source electrode 136 and the drain electrode 134 may be connected to the source region 133b and the drain region 133a, respectively. The gate electrode 135 may be arranged on the gate insulating layer 124a. The first to third switching units SW1 to SW3 may be arranged spaced apart from each other not to contact the adjacent wavelength converting units and may be arranged in a smaller size than a size of the barrier structure 110. That is, the first to third switching units SW1 to SW3 may be arranged to have a smaller width than a width of the barrier structure 110 in which the first to third switching units SW1 to SW3 are provided. The connection electrode 137 may be arranged between the source electrode 136 and the second electrode 129 of each of the first to third semiconductor light emitting units LED1 to LED3. Accordingly, the first to third switching units SW1 to SW3 may be electrically connected to the first to third semiconductor light emitting units LED1 to LED3, respectively.

Figure 8A:
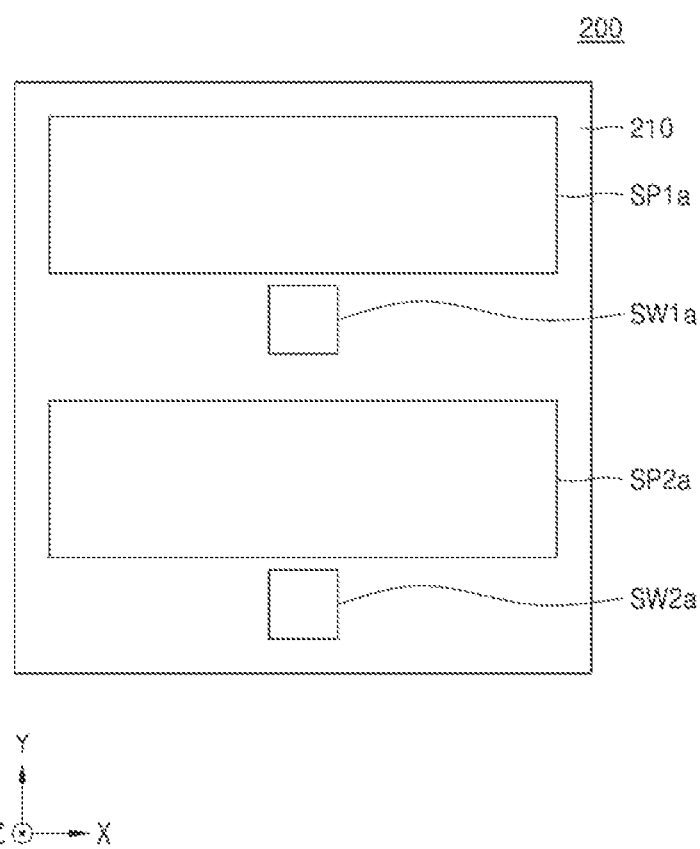
FIGS. 8A and 8B are plan views of a light emitting device package according to an embodiment.
Figure 8B:
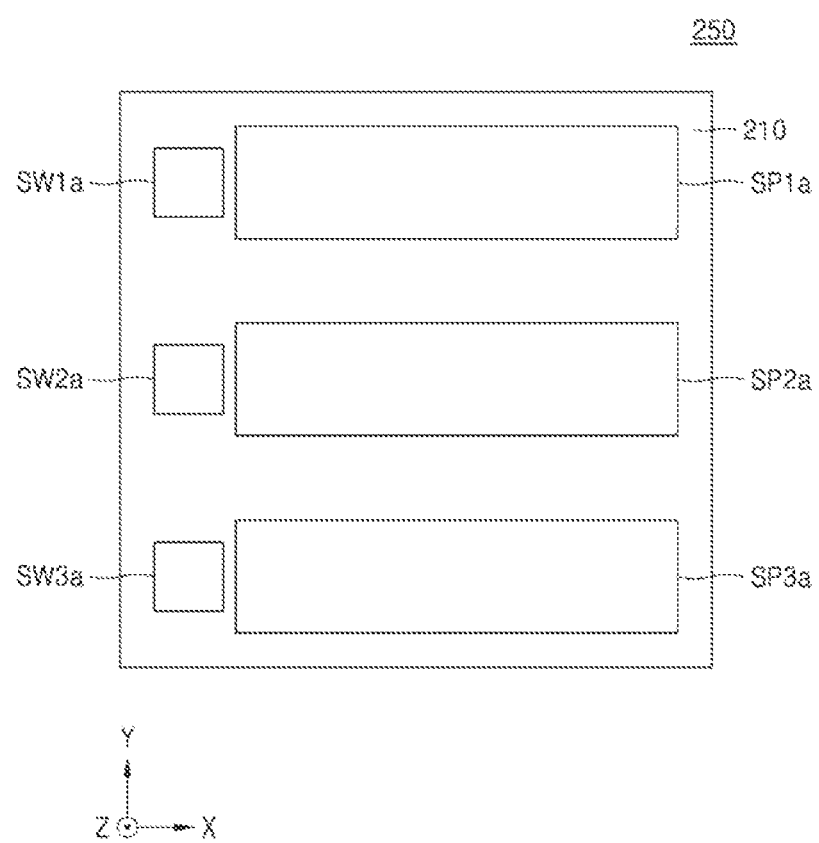

FIGS. 8A and 8B are plan views of a light emitting device package according to an embodiment.

Particularly, a light emitting device package 200 of FIG. 8A may be similar to the light emitting device package 100 of FIG. 3 except that two subpixels SP1a and SP2a and two switching units SW1a and SW2a are arranged in a barrier structure 210. In other words, the light emitting device package 200 of FIG. 8A may include two semiconductor light emitting units and two switching units SW1a and SW2a arranged respectively corresponding to the subpixels SP1a and SP2a. In this arrangement, the first and second subpixels SP1a and SP2a may be arranged to have a larger size than in other cases. While the switching units SW1a and SW2a are shown below the subpixels SP1a and SP2a in FIG. 8A, this arrangement is only an example, and the switching units SW1a and SW2a may be arranged above the subpixels SP1a and SP2a in some embodiments.

A light emitting device package 250 of FIG. 8B may be similar to the light emitting device package 100 of FIG. 3 except that switching units SW1a to SW3a are arranged not between subpixels SP1a to SP3a but in a barrier structure 210 on one side of the subpixels SP1a to SP3a. In other words, the light emitting device package 250 of FIG. 8B may include switching units SW1a to SW3a located on one side of three semiconductor light emitting units corresponding to the subpixels SP1a to SP3a. In this arrangement, the arrangement freedom of the switching units SW1a to SW3a or the size of the first to third subpixels SP1a to SP3a may be greater than in other cases. While the switching units SW1a to SW3a are shown to the left of the subpixels SP1a to SP3a in FIG. 8B, this arrangement is only an example, and the switching units SW1a to SW3a may be arranged to the right of the subpixels SP1a to SP3a in some embodiments.

Figure 9:
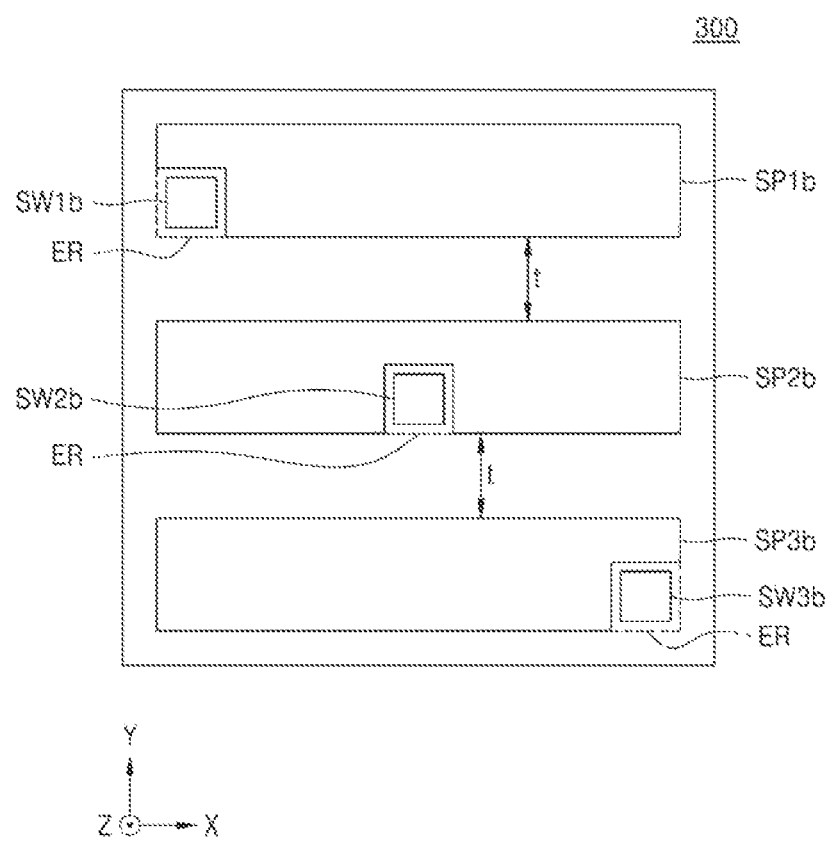
FIG. 9 is a plan view of a light emitting device package according to an embodiment.

FIG. 9 is a plan view of a light emitting device package according to an embodiment.

Particularly, a light emitting device package 300 of FIG. 9 may be similar to the light emitting device package 100 of FIG. 3 except that one region ER of a barrier structure 310 protrudes inside first to third subpixels SP1b to SP3b.

In other words, in the light emitting device package 300 of FIG. 9, switching units SW1b to SW3b formed in the barrier structure 310 may be arranged in regions protruding inside semiconductor light emitting units corresponding to the first to third subpixels SP1b to SP3b.

In this arrangement, since the thickness t between the first to third subpixels SP1b to SP3b may be made smaller due to the switching units SW1b to SW3b not being formed in the thickness t region between the first to third subpixels SP1b to SP3b, the size of the first to third subpixels SP1b to SP3b may be greater than in other cases.

Figure 10A:
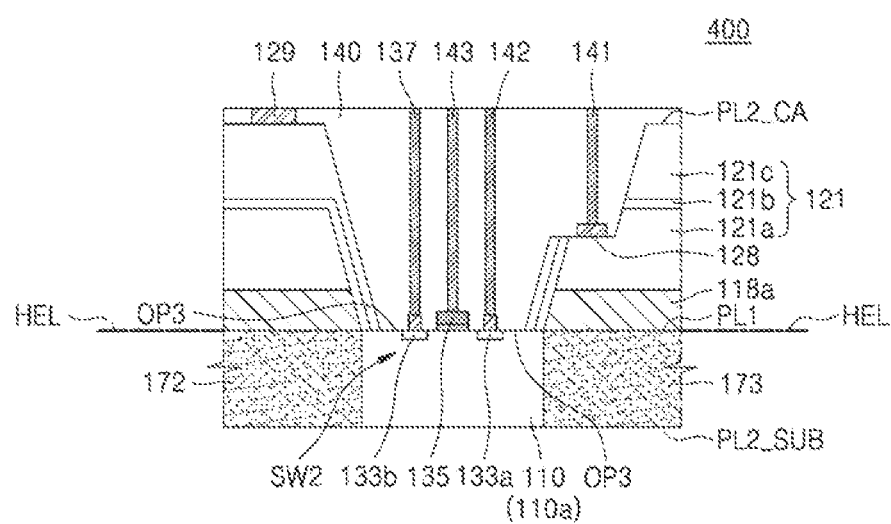
FIGS. 10A to 10C are cross-sectional views of a light emitting device package according to an embodiment.
Figure 10B:
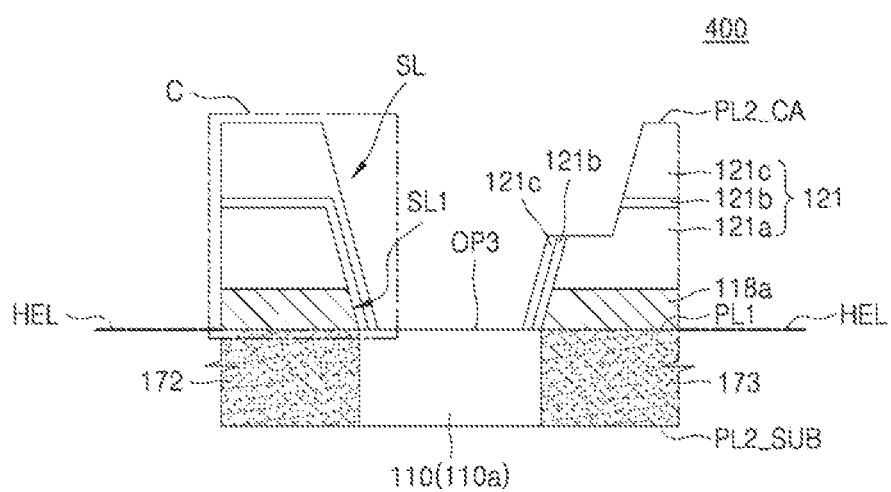
Figure 10C:
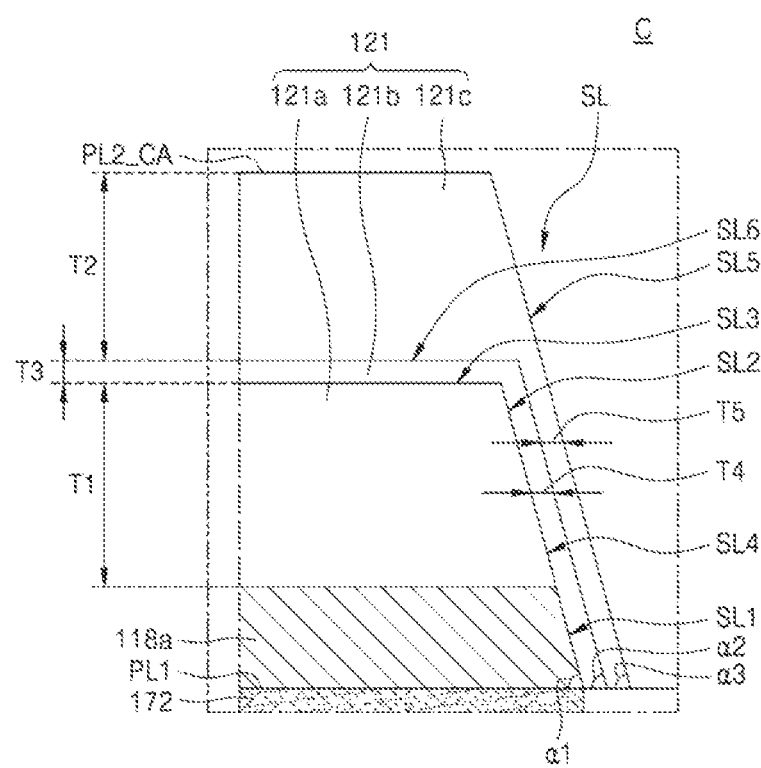

FIGS. 10A to 10C are cross-sectional views of a light emitting device package according to an embodiment.

Particularly, for the sake of convenience, FIG. 10B does not illustrate some components of FIG. 10A, such as a switching unit SW2 and first to third conductive vias 141 to 143. FIG. 10A is a cross-sectional view taken along line of FIG. 3. FIG. 10C is an enlarged view of a portion C of FIG. 10B.

A light emitting device package 400 of FIGS. 10A to 10C may be similar to the light emitting device package 100 of FIGS. 5 to 7 except that a connection electrode 137 is formed in the shape of a conductive via. In FIGS. 10A to 10C, the same descriptions as those in FIGS. 5 to 7 will be briefly provided or omitted.

The light emitting device package 400 may include a substrate 110a having a first surface PL1 and a second surface PL2_SUB located opposite to the first surface PL1. That is, the first surface PL1 and the second surface PL2_SUB are provided on opposite sides of the substrate 110a. The substrate 110a may constitute a barrier structure 110. The light emitting device package 400 may include, on at least a portion of a horizontal extension line HEL of the first surface PL1, a plurality of light emitting structures 121 each including a first conductivity type semiconductor layer 121a, an active layer 121b, and a second conductivity type semiconductor layer 121c sequentially formed on a surface SL3 including a sidewall SL2 of the first conductivity type semiconductor layer 121a (best seen in FIG. 3).

The light emitting structure 121 may constitute a semiconductor light emitting unit. The light emitting structure 121 may include a first conductivity type semiconductor layer 121a formed on a buffer layer 118a, and an active layer 121b and a second conductivity type semiconductor layer 121c sequentially formed on the surface SL3 and the sidewalls SL1 and SL2 of the buffer layer 118a and the first conductivity type semiconductor layer 121a.

The light emitting structures 121 may be arranged over the first surface PL1 of the substrate 110a to be spaced apart from each other and may be formed with the buffer layer 118a therebetween. The light emitting structure 121 may have a second surface PL2_CA located opposite to the first surface PL1. That is, the first surface PL1 and the second surface PL2_CA are on opposite sides of the light emitting structure 121. The light emitting structure 121 may be covered by a molding unit 140.

One sidewall SL of the light emitting structure 121 may be formed to be inclined. Particularly, the sidewalls SL1 and SL2 of the buffer layer 118a and the first conductivity type semiconductor layer 121a may be formed to be inclined upward from the first surface PL1. The sidewalls SL1 and SL2 of the buffer layer 118a and the first conductivity type semiconductor layer 121a may be formed to be inclined at an inclination angle α1 upward from the first surface PL1. Accordingly, sidewalls SL4 and SL5 of the active layer 121b and the second conductivity type semiconductor layer 121c may also be formed at inclination angles α2 and α3 upward from the first surface PL1, respectively. The inclination angle α1 may be equal to the inclination angles α2 and α3. The inclination angles α1, α2, and α3 may be about 50 degrees to about 70 degrees.

The first conductivity type semiconductor layer 121a may be formed to a thickness T1 on the buffer layer 118a. The active layer 121b may have a thickness T3 on the surface SL3 of the first conductivity type semiconductor layer 121a and may have a thickness T4 on the sidewall SL2 of the first conductivity type semiconductor layer 121a. The thickness T4 of the active layer 121b on the sidewall SL2 of the first conductivity type semiconductor layer 121a may be less than or equal to the thickness T3 of the active layer 121b on the surface SL3 of the first conductivity type semiconductor layer 121a.

The second conductivity type semiconductor layer 121c may have a thickness T2 on a surface SL6 of the active layer 121b and may have a thickness T5 on the sidewall SL4 of the active layer 121b. The thickness T5 of the second conductivity type semiconductor layer 121c on the sidewall SL4 of the active layer 121b may be less than the thickness T2 of the second conductivity type semiconductor layer 121c on the surface SL6 of the active layer 121b. Accordingly, the thickness of at least one of the active layer 121b and the second conductivity type semiconductor layer 121c formed along the sidewalls SL1, SL2, and SL4 may be less than the thickness of the active layer 121b and the second conductivity type semiconductor layer 121c stacked on the surface SL3 of the first conductivity type semiconductor layer 121a.

In the light emitting device package 400, the light emitting structure 121 may be partially etched to form a first electrode 128 on the first conductivity type semiconductor layer 121a. A second electrode 129 may be formed on the second conductivity type semiconductor layer 121c. The light emitting device package 400 may include second and third wavelength converting units 172 and 173 that are arranged under the first surface PL1 of the substrate 110a to be spaced apart from each other while contacting the buffer layer 118a. The light emitting device package 400 may include a switching unit SW2 that is arranged over/under the first surface PL1 of the substrate 110a to be spaced apart from the light emitting structure 121 and is electrically connected to the light emitting structure 121.

The switching unit SW2 may include an exposure region OP3 exposing the first surface PL1 of the substrate 110a. In other words, the switching unit SW2 may be formed in the exposure region OP3. The switching unit SW2 may include a source region 133b, a drain region 133a, and a gate electrode 135. In the molding unit 140, first to third conductive vias 141 to 143 may be connected to the first electrode 128, the drain region 133a, and the gate electrode 135. A connection electrode 137 may be formed in the shape of a conductive via in the source region 133b.

Figure 11A:
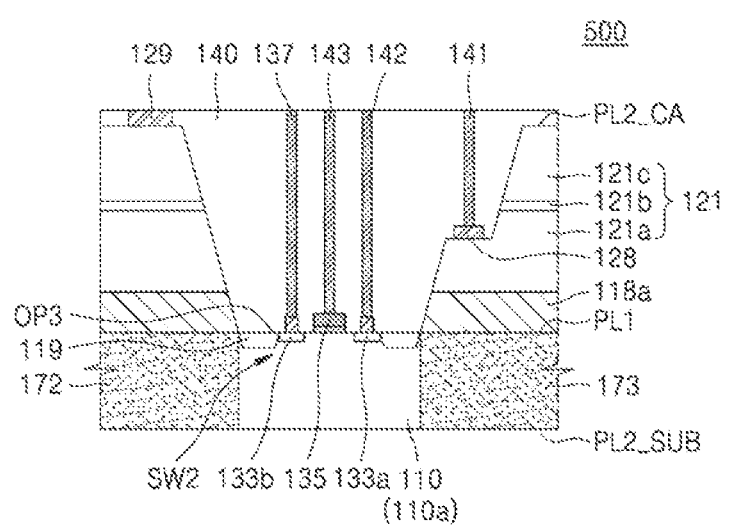
FIGS. 11A and 11B are cross-sectional views of a light emitting device package according to an embodiment.
Figure 11B:
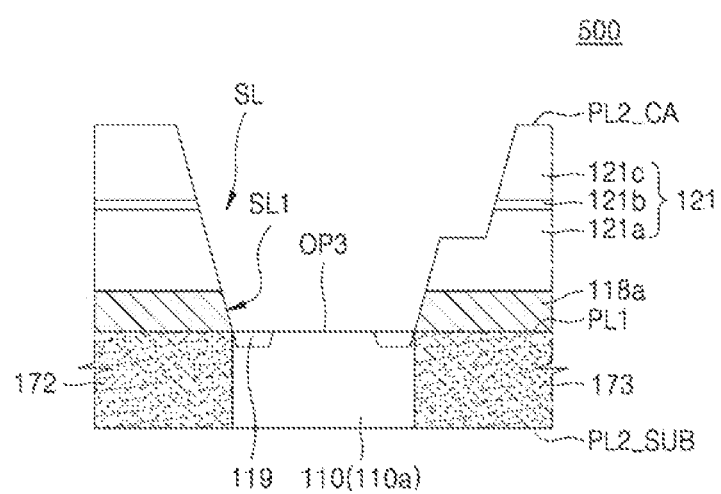

FIGS. 11A and 11B are cross-sectional views of a light emitting device package according to an embodiment.

Particularly, for the sake of convenience, FIG. 11B does not illustrate some components of FIG. 11A, such as a switching unit SW2 and conductive vias 141 to 143. FIG. 11A is a cross-sectional view taken along line of FIG. 3.

A light emitting device package 500 of FIGS. 11A and 11B may be similar to the light emitting device package 400 of FIGS. 10A to 10C except that a recess portion 119 is formed in the substrate 110a, and an active layer 121b and a second conductivity type semiconductor layer 121c are not formed on the sidewalls of a buffer layer 118a and a first conductivity type semiconductor layer 121a constituting a light emitting structure 121. In FIGS. 11A and 11B, the same descriptions as those in FIGS. 5 to 7 and FIGS. 10A to 10C will be briefly provided or omitted.

The light emitting device package 500 may include a substrate 110a having a first surface PL1 and a second surface PL2_SUB located opposite to the first surface PL1. That is, the first surface PL1 and the second surface PL2_SUB are located on opposite sides of the substrate 110a. The substrate 110a may constitute a barrier structure 110. Light emitting structures 121 may be arranged over the first surface PL1 of the substrate 110a to be spaced apart from each other and may be formed with a buffer layer 118a therebetween. The light emitting structure 121 may constitute a semiconductor light emitting unit.

The light emitting structure 121 may include a first conductivity type semiconductor layer 121a formed on the buffer layer 118a, and an active layer 121b and a second conductivity type semiconductor layer 121c sequentially formed on the surfaces of the buffer layer 118a and the first conductivity type semiconductor layer 121a. Sidewalls SL1 and SL2 of the buffer layer 118a and the light emitting structure 121 may be formed to be inclined upward from the first surface PL1.

The light emitting device package 500 may include a switching unit SW2 that is arranged over/under the first surface PL1 of the substrate 110a to be spaced apart from the light emitting structure 121 and is electrically connected to the light emitting structure 121. The switching unit SW2 may include an exposure region OP3 exposing the first surface PL1 of the substrate 110a. In other words, the switching unit SW2 may be formed in the exposure region OP3.

A recess portion 119 may be formed in the exposure region OP3. The recess portion 119 may be recessed from the first surface PL1 toward the second surface PL2_SUB of the substrate 110a. The recess portion 119 may be formed to have a step at the first surface PL1 of the substrate 110a where the switching unit SW2 is formed. The recess portion 119 may contact the buffer layer 118a and the light emitting structure 121 while being spaced apart from the switching unit SW2. A molding unit 140 covering the light emitting structure 121 may be buried in the recess portion 119.

Figure 12A:
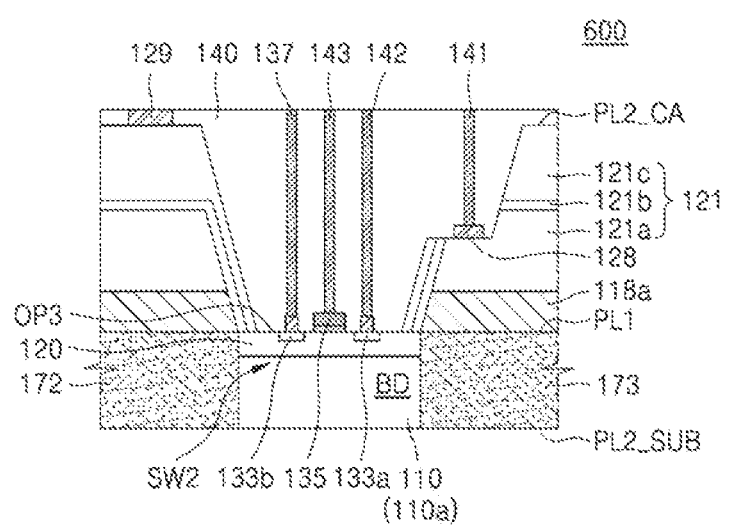
FIGS. 12A and 12B are cross-sectional views of a light emitting device package according to an embodiment.
Figure 12B:
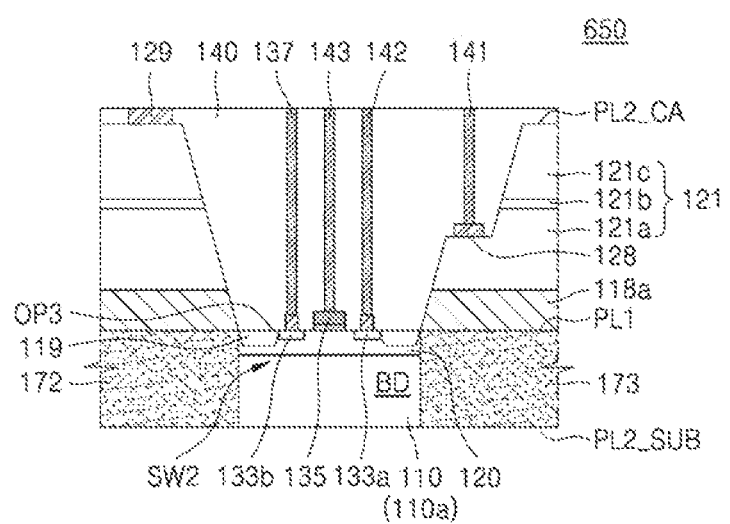

FIGS. 12A and 12B are cross-sectional views of a light emitting device package according to an embodiment.

Particularly, light emitting device packages 600 and 650 of FIGS. 12A and 12B may be similar to the light emitting device packages 400 and 500 of FIGS. 10A and 11A except that a low-concentration impurity layer 120 is formed at a substrate 110a. In FIGS. 12A and 12B, the same descriptions as those in FIGS. 5 to 7, FIGS. 10A to 10C, and FIGS. 11A and 11B will be briefly provided or omitted.

In the light emitting device packages 600 and 650 of FIGS. 12A and 12B, the substrate 110a may include a semiconductor substrate including silicon (Si). Also, the substrate 110a may include a body layer BD doped with high-concentration impurities and a low-concentration impurity layer 120 doped with lower-concentration impurities than the body layer BD.

When the substrate 110a is a P-type silicon substrate, the boron doping concentration of the body layer BD may be as high as about 1E19 and the boron doping concentration of the low-concentration impurity layer 120 may be as low as about 1E15. In this case, a buffer layer 118a and a light emitting structure 121 may be easily formed in a manufacturing process of the light emitting device packages 600 and 650.

Figure 14:
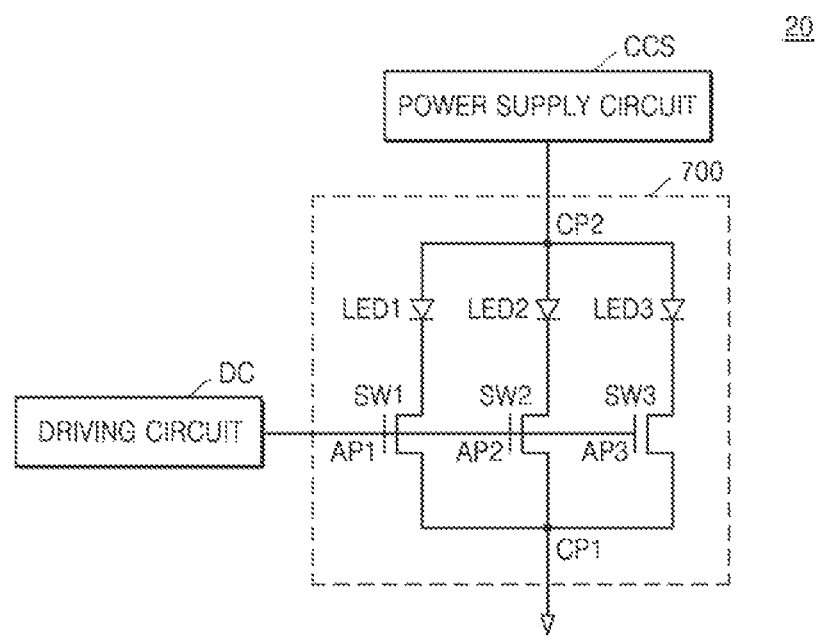

FIGS. 13 and 14 are circuit diagrams of a light emitting device package according to an embodiment.

Referring to FIG. 13, the circuit diagram of FIG. 13 is provided to describe a circuit configuration of the light emitting device package 100 including the first to third switching units SW1 to SW3 and the first to third semiconductor light emitting units LED1 to LED3, which have been described above.

The drain electrodes of the first to third switching units SW1 to SW3 may be connected to the common electrode pad CP2 to receive power from the power supply circuit CCS, and the source electrodes thereof may be connected to one side of the first to third semiconductor light emitting units LED1 to LED3.

The gate electrodes thereof may be connected to the individual electrode pads AP1 to AP3 respectively. Thus, the gate electrodes of the first to third switching units SW1 to SW3 may be turned on/off by a control signal of the driving circuit DC connected to the individual electrode pads AP1 to AP3, to control the power applied to the first to third semiconductor light emitting units LED1 to LED3.

Referring to FIG. 14, the circuit diagram of a light emitting device package 700 of FIG. 14 may be similar to the circuit diagram of FIG. 13 except that the first to third semiconductor light emitting units LED1 to LED3 are connected to the drain electrodes of the first to third switching units SW1 to SW3 respectively. The circuit operation of FIG. 14 may be the same as that described with reference to FIG. 13, and thus will not be described herein.

In the light emitting device packages 100 to 700 of the various embodiments described above, the switching units for controlling the semiconductor light emitting units may be formed in the barrier structure to control the on/off of the semiconductor light emitting units for outputting image signals. Thus, in comparison with the case where a separate thin film transistor substrate is required, the manufacturing cost of a light emitting device package may be reduced and an ultra-thin display apparatus having a smaller thickness may be implemented.

Next, a method of manufacturing a light emitting device package according to an embodiment will be described below. A method of manufacturing a light emitting device package described below may relate to a method of manufacturing a wafer-level chip-scale package. In the main process drawings, cross sections of some light emitting device packages will be enlarged for easier understanding.

FIGS. 15A to 23B are cross-sectional views illustrating a method of manufacturing a light emitting device package according to an embodiment.

Particularly, FIGS. 15A to 23B are to describe a method of manufacturing the light emitting device package 100 of FIGS. 5 and 6. FIGS. 15A to 23A are to describe a method of manufacturing a light emitting device package according to I-I' of FIG. 3, and FIGS. 15B to 23B are to describe a manufacturing method according to II-II' of FIG. 3.

Figure 15B:
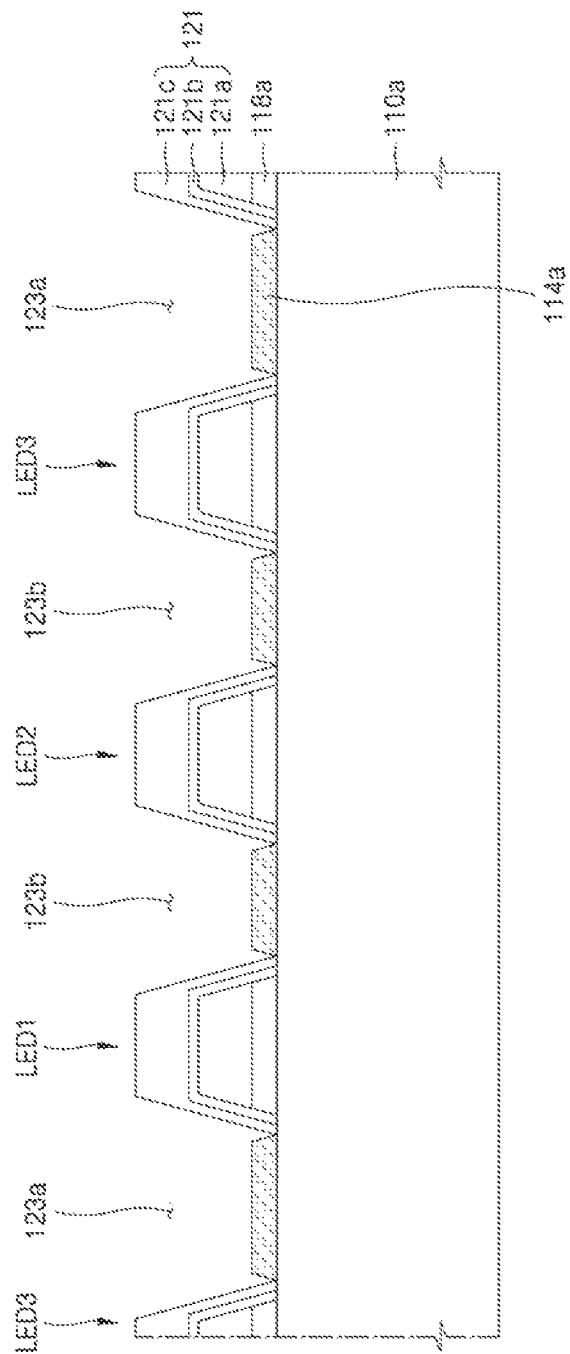

Referring to FIGS. 15A and 15B, a mask layer 114a and a buffer layer 118a may be formed on a substrate 110a. The mask layer 114a may be a protection layer for protecting the substrate 110a in a subsequent process. The substrate 110a may include an insulating, conductive, or semiconductor substrate. The substrate 110a may include a semiconductor substrate that may be doped with impurities to form a metal oxide silicon field effect transistor (MOSFET). For example, the substrate 110a may include a Group IV semiconductor substrate or a Group III-IV compound semiconductor substrate. The substrate 110a may include, for example, a Si substrate, a SiC substrate, or a SiGe substrate.

The forming of the mask layer 114a and the buffer layer 118a may include forming a mask material layer on the substrate 110a and then patterning the mask material layer to form the mask layer 114a and forming the buffer layer 118a on the substrate 110a except the mask layer 114a.

Subsequently, a light emitting structure 121 including a first conductivity type semiconductor layer 121a, an active layer 121b, and a second conductivity type semiconductor layer 121c may be formed on the buffer layer 118a. The light emitting structure 121 may include an epitaxial layer of a group III nitride-based semiconductor layer formed on the substrate 110a to form a plurality of emission regions.

The first conductivity type semiconductor layer 121a may include a nitride semiconductor satisfying N-type $In_xA$-

$In_yGa_{1-x-y}N$ ($0 \le x < 1$, $0 \le y < 1$, $0 \le x+y < 1$), and the N-type impurities may include, for example, Si, Ge, Se, or Te.

The active layer 121b may include a multiple quantum well (MQW) structure in which quantum well layers and quantum barrier layers are alternately stacked. For example, the quantum well layer and the quantum barrier layer may include $In_xAl_yGa_{1-x-y}N$ ($0 \le x \le 1$, $0 \le y \le 1$, $0 \le x+y \le 1$) having different compositions. In an embodiment, the quantum well layer may include $In_xGa_{1-x}N$ ($0 < x \le 1$) and the quantum barrier layer may include GaN or AlGaN. The second conductivity type semiconductor layer 121c may include a nitride semiconductor layer satisfying P-type $In_xAl_yGa_{1-x-y}N$ ($0 \le x < 1$, $0 \le y < 1$, $0 \le x+y < 1$). The P-type impurities may include, for example, Mg, Zn, or Be.

Subsequently, a mesa-etched region 122 may be formed at the light emitting structure 121 by performing an etching process to expose a partial region of the first conductivity type semiconductor layer 121a. The etching process may be performed as a process of removing a partial region of the second conductivity type semiconductor layer 121c and the active layer 121b. The region of the first conductivity type semiconductor layer 121a exposed by the mesa-etched region 122 may form an electrode.

Next, an isolation process may be performed to divide the light emitting structure 121 into a plurality of emission regions, that is, a plurality of semiconductor light emitting units LED1 to LED3. An isolation region 123a may be formed to penetrate the light emitting structure 121 to expose the surface of the substrate 110a. Through this process, the light emitting structure 121 may be divided into a plurality of emission regions and supported by the substrate 110a.

The isolation region 123a may be formed every three emission regions. A sub isolation region 123b may be formed between three emission regions (i.e., LED1, LED2, LED3 in FIG. 15B). The isolation process may include a process of forming the isolation region 123a by using a blade, but the inventive concept is not limited thereto. The sub isolation region 123b may be formed by a separate process different from the process of forming the isolation region 123a, or may be formed by the same process as the isolation region 123a. The sub isolation region 123b may be formed to be narrower than the isolation region 123a. In the isolation process, a portion of the substrate 110a corresponding to the sub isolation region 123b may be protected by the mask layer 114a.

Referring to FIGS. 16A to 17B, the mask layer 114a may be removed as illustrated in FIGS. 16A and 16B. In the isolation process, since a portion of the substrate 110a corresponding to the sub isolation region 123b is protected by the mask layer 114a, defects and/or damage in an exposure region OP of the substrate 110a between the light emitting structures 121 may be reduced. Accordingly, a switching unit may be reliably formed in the sub isolation region 123b in a subsequent process. Subsequently, an insulating layer 124 may be deposited to cover the surface of the substrate 110a and the light emitting structure 121.

Figure 17A:
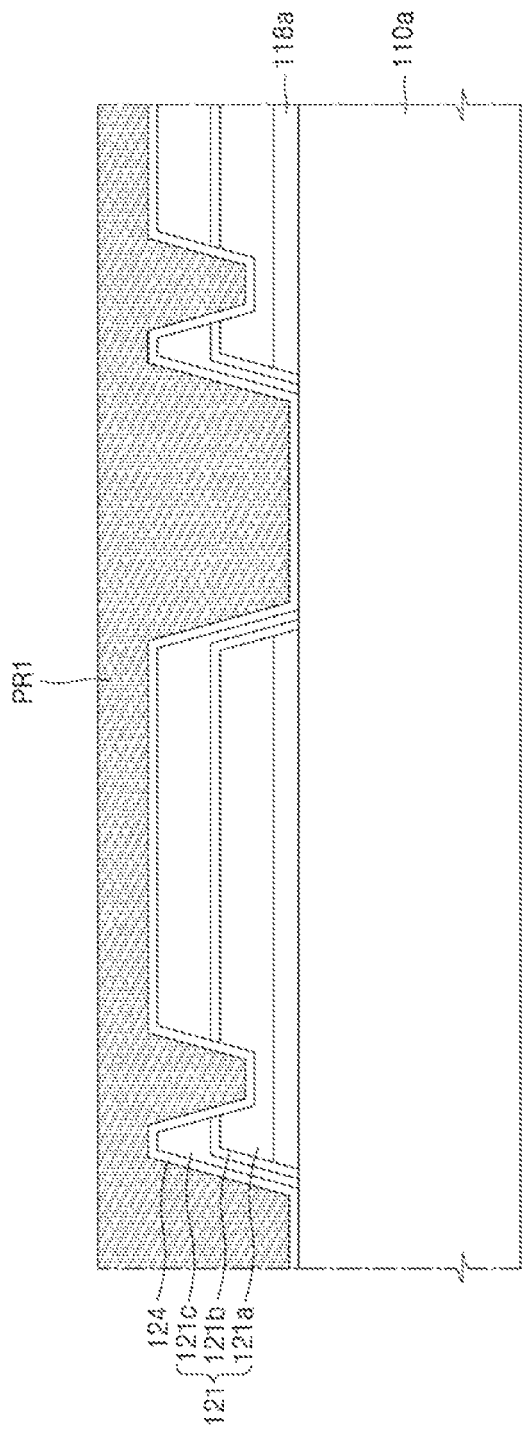
Figure 17B:
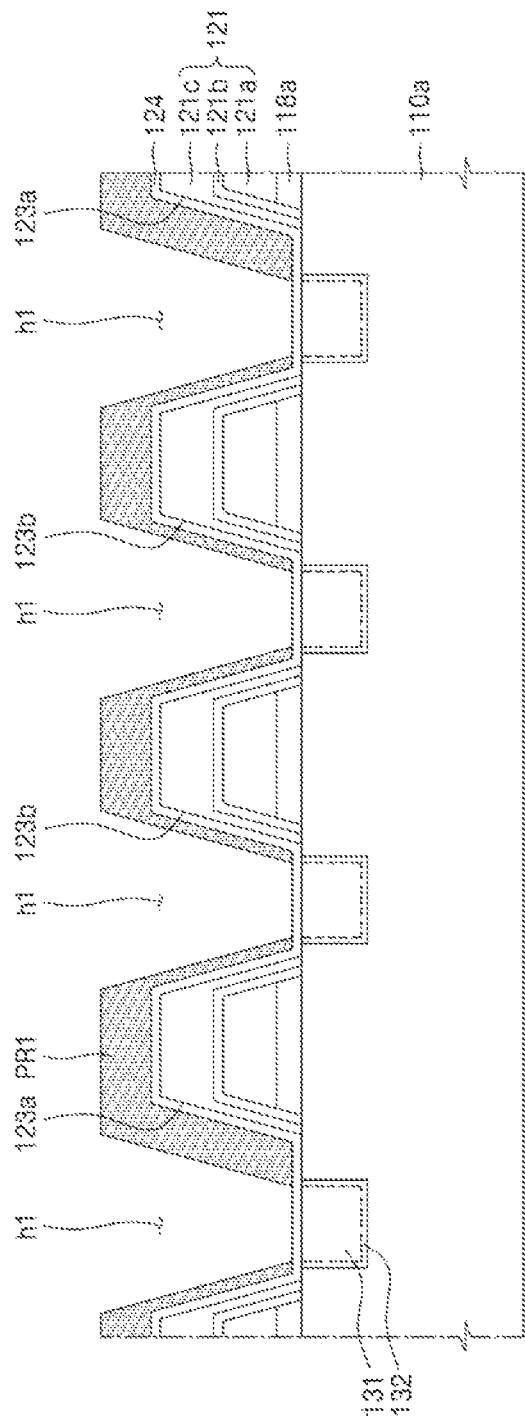

Subsequently, as illustrated in FIGS. 17A and 17B, a first photoresist layer PR1 may be applied to cover the insulating layer 124, an opening h1 may be formed to expose one region of the isolation region 123a and the sub isolation region 123b, and then a P-well region 131 may be formed by implanting P-type impurities into the isolation region 123a and the sub isolation region 123b. By implanting N-type impurities before forming the P-well region 131, an N-type pocket 132 may be formed around a region where the P-well region 131 is to be formed. The first photoresist layer PR1 may be removed after the P-well region 131 is formed.

Figure 18B:
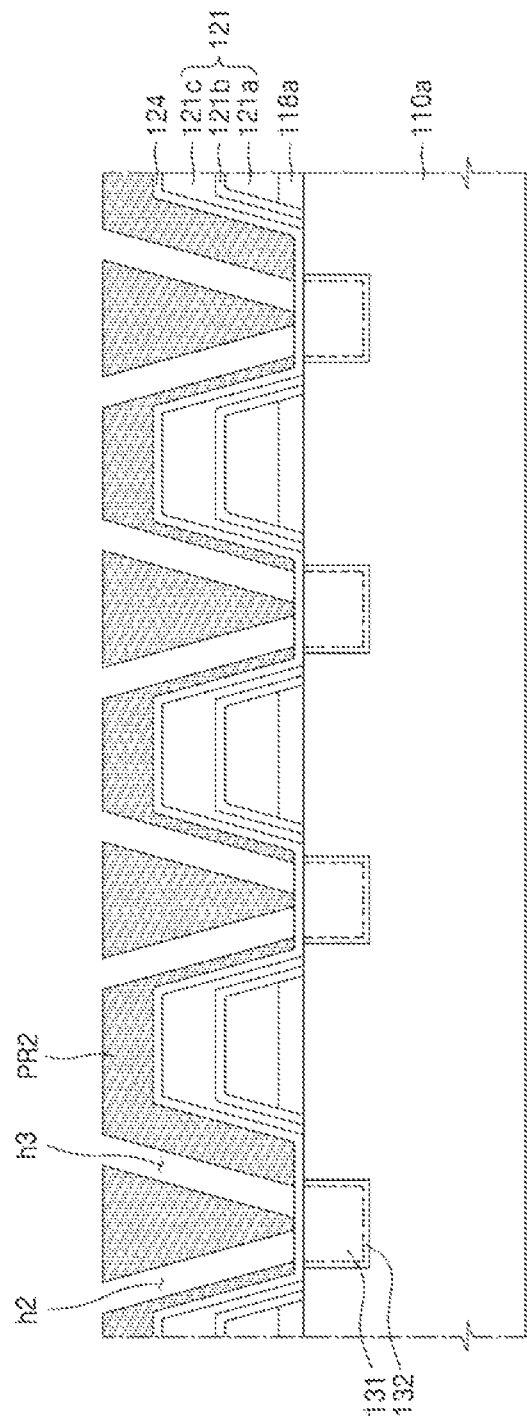

Referring to FIGS. 18A and 18B, a second photoresist layer PR2 may be applied to cover the insulating layer 124, and openings h2 and h3 for forming N-well regions (133a of FIG. 19B and 133b of FIG. 19B) in the P-well region 131 may be formed. The second photoresist layer PR2 may be removed after the N-well regions 133a and 133b are formed. According to embodiments, the insulating layer 124 may be removed and then re-deposited.

Figure 19B:
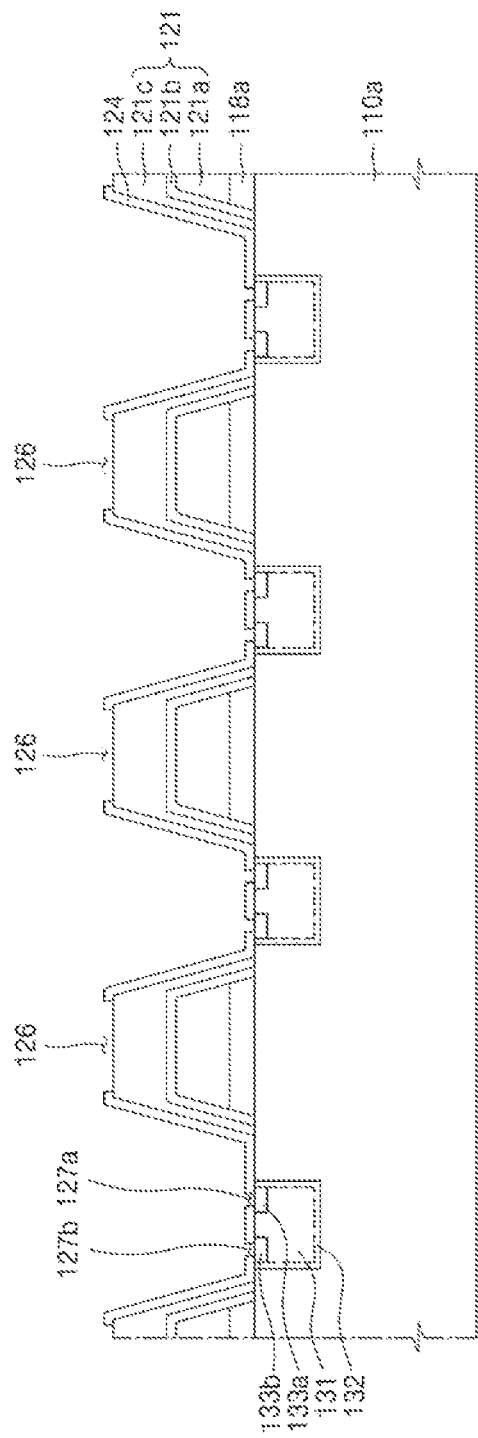
Figure 20A:
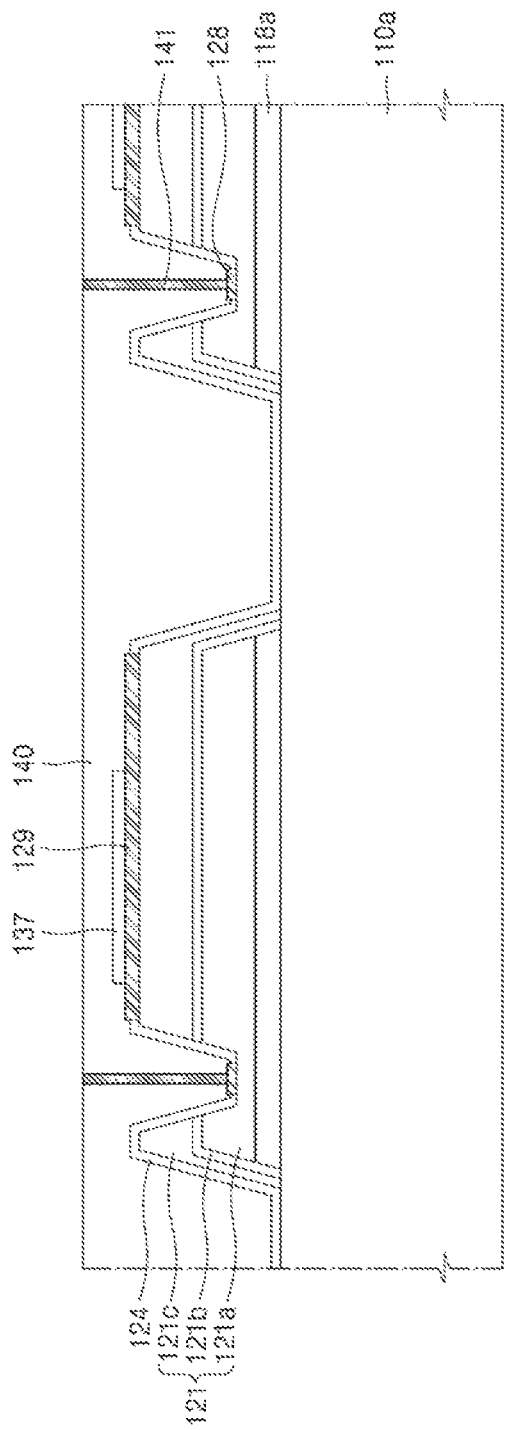

Referring to FIGS. 19A to 20B, as illustrated in FIGS. 19A and 19B, openings 125, 126, 127a, and 127b may be formed by removing some regions of the insulating layer 124. As illustrated in FIGS. 20A and 20B, a first electrode 128, a second electrode 129, a drain electrode 134, and a source electrode 136 may be formed by depositing a conductive material on the openings 125, 126, 127a, and 127b. The first and second electrodes 128 and 129 may include a reflective electrode including at least one of Ag, Al, Ni, Cr, Cu, Au, Pd, Pt, Sn, W, Rh, Ir, Ru, Mg, and Zn, or any alloy thereof.

A connection electrode 137 may be formed to electrically connect the source electrode 136 and the second electrode 129. The source electrode 136 and the second electrode 129 may be formed and then the connection electrode 137 may be formed to connect the source electrode 136 and the second electrode 129. However, the inventive concept is not limited thereto and the source electrode 136, the second electrode 129, and the connection electrode 137 may be integrally formed. A gate electrode 135 may be formed on a gate insulating layer 124a. The gate electrode 135 may include at least one of doped Si, W, and TiN, or any alloy thereof.

Subsequently, first to third conductive vias 141 to 143 may be formed at the first electrode 128, the drain electrode 134, and the gate electrode 135 respectively, and a molding unit 140 may be formed to cover the first to third semiconductor light emitting units LED1 to LED3.

Figure 21A:
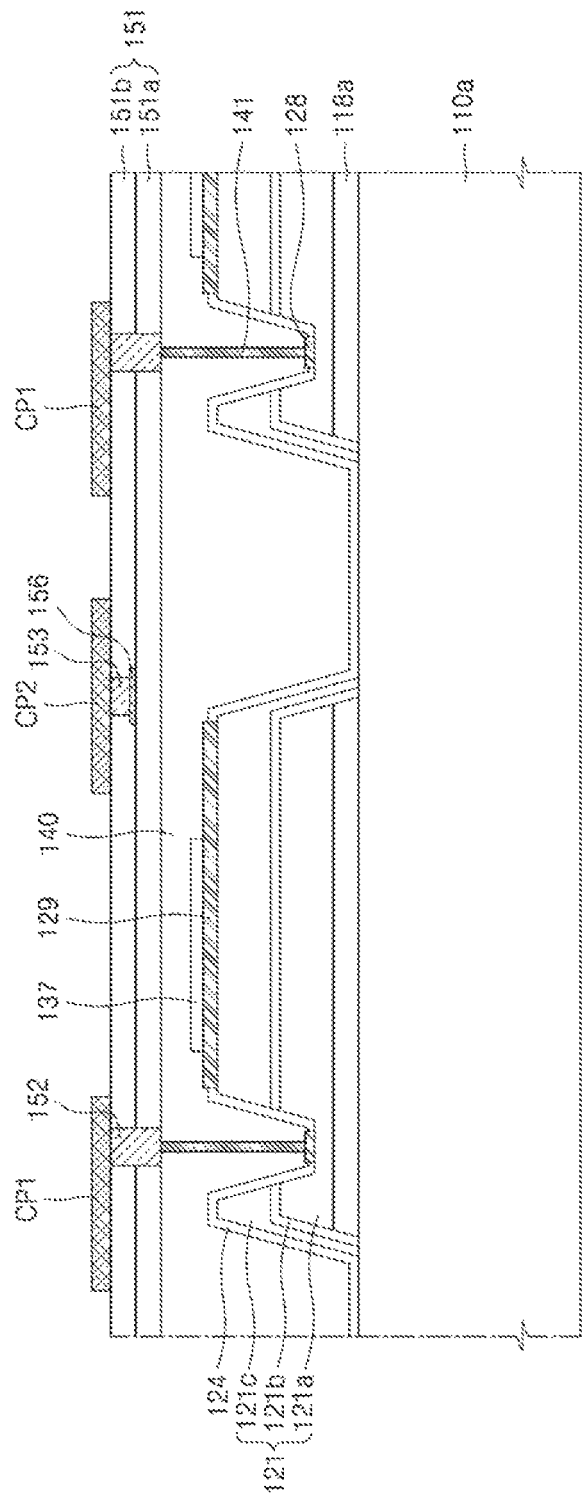
Figure 21B:
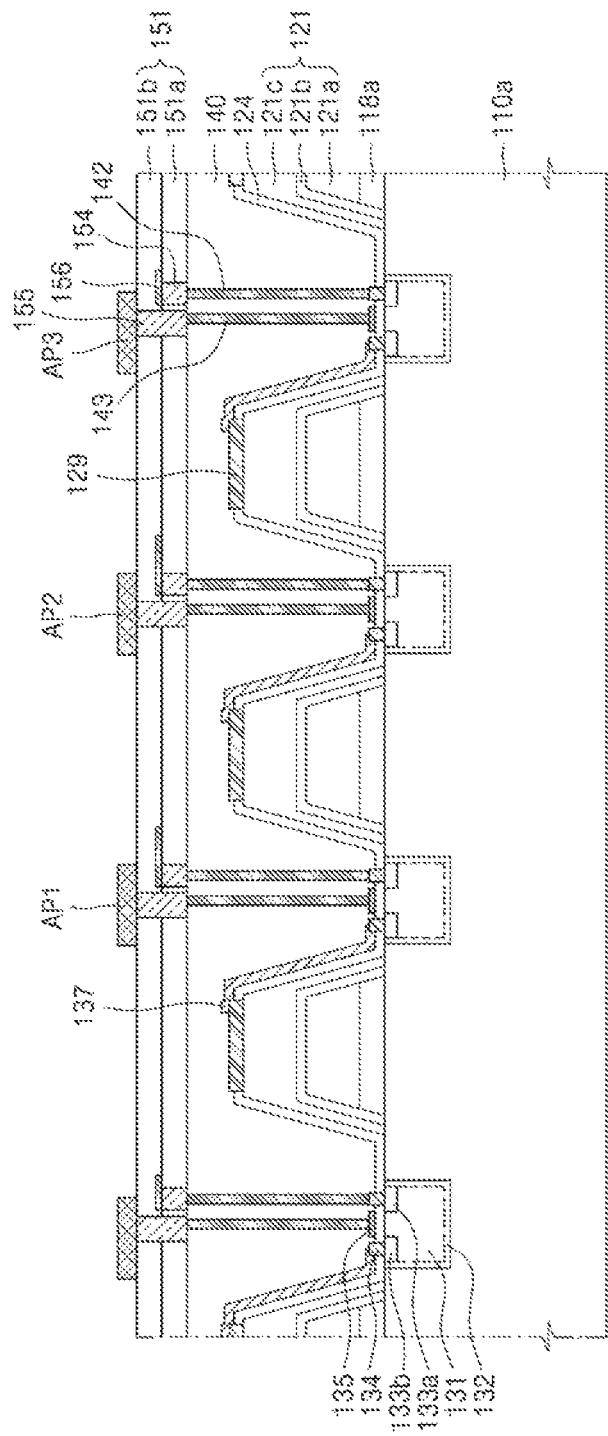

Referring to FIGS. 21A and 21B, a circuit board 151 may be arranged to connect the first to third conductive vias 141 to 143 to the common electrode pads CP1 and CP2 and the individual electrode pads AP1 to AP3. The circuit board 151 may include a plurality of printed circuit boards 151a and 151b stacked therein, and the plurality of printed circuit boards 151a and 151b may include through electrodes 152, 153, 154, and 155 and a line 156. The common electrode pads CP1 and CP2 and the individual electrode pads AP1 to AP3 may be arranged on one surface of the circuit board 151.

Referring to FIGS. 22A and 22B, first to third light emitting windows 111 to 113 may be formed by etching some regions of the substrate 110a corresponding to the first to third semiconductor light emitting units LED1 to LED3. The light emitting windows 111 to 113 may include through holes penetrating to first surface (PL1 of FIGS. 5 and 6) from the second surface (PL2_SUB of FIGS. 5 and 6) of the substrate 110a. That is, the holes may extend from the first surface to the second surface of the substrate 110a.

Subsequently, second and third wavelength converting units 172 and 173 may be formed by dispensing light-transmissive liquid resins mixed with wavelength converting materials such as green and red phosphors P2 and P3 to the second and third light emitting windows 112 and 113, and a first wavelength converting unit 171 may be formed by dispensing a light-transmissive liquid resin having no phosphor mixed therein to the first light emitting window 111. In an embodiment, the first wavelength converting unit 171 may include a blue or cyan (e.g., about 480 nm to about 520 nm) phosphor P1 for adjusting the color coordinates of blue light.

Figure 23A:
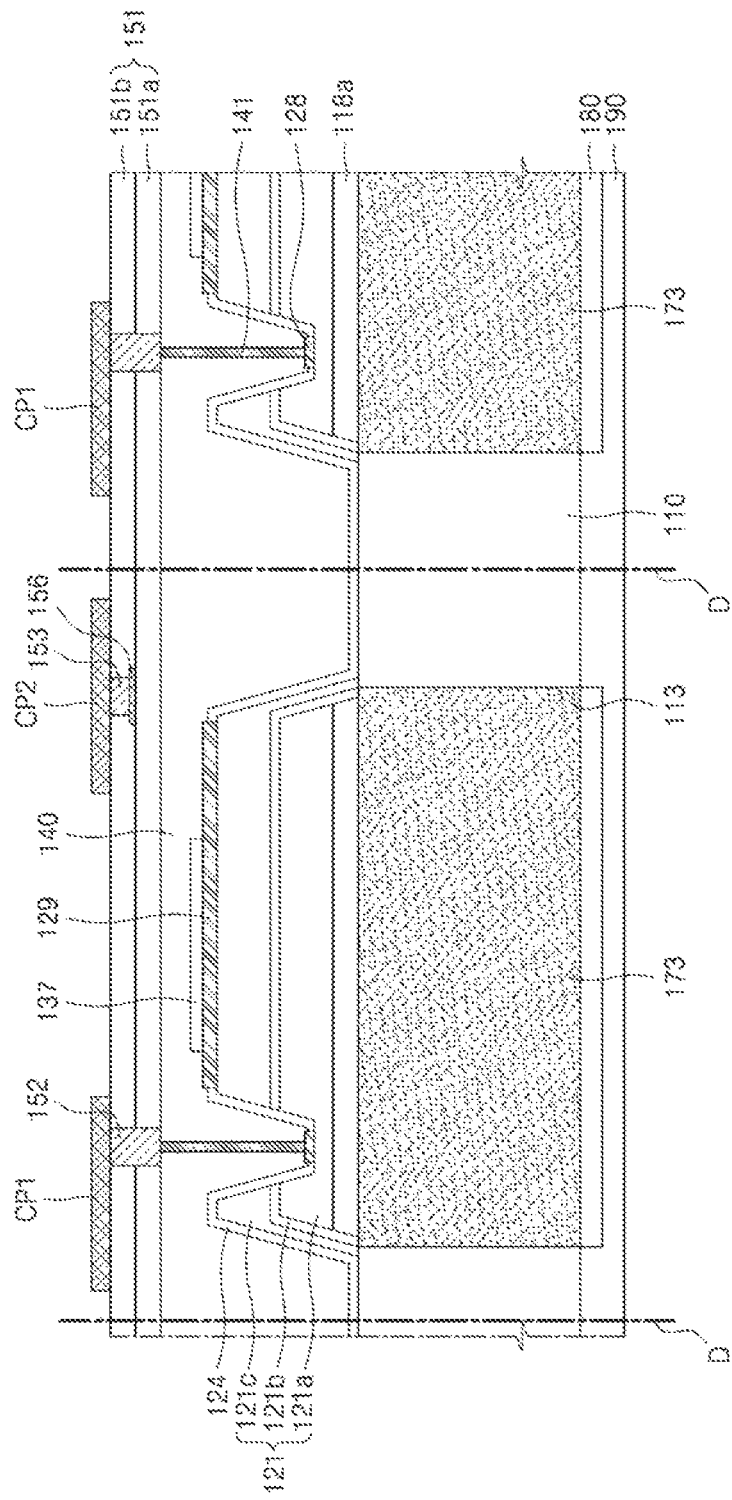
Figure 23B:
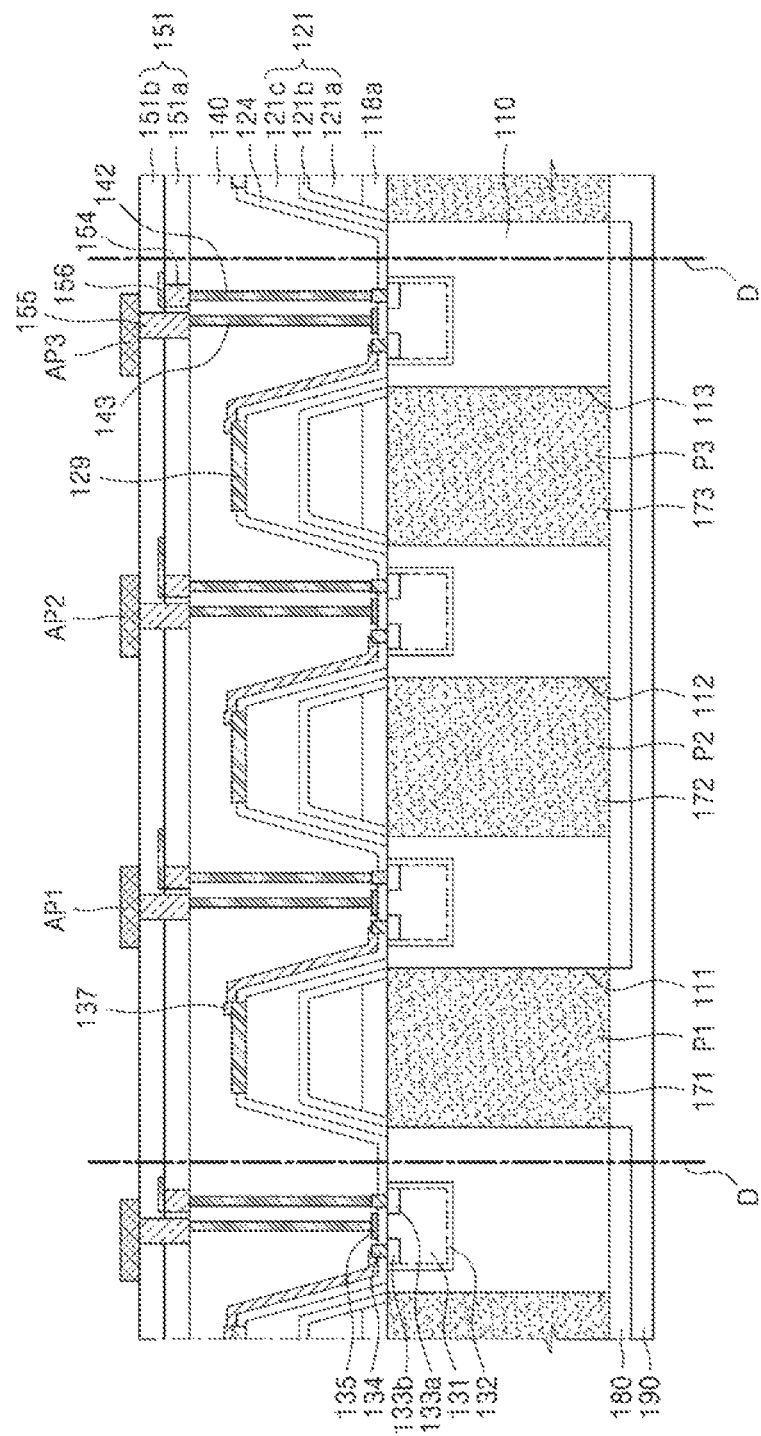

Referring to FIGS. 23A and 23B, an optical filter layer 180 may be arranged at the second and third wavelength converting units 172 and 173, and an encapsulation unit 190 may be formed on the first to third wavelength converting units 171 to 173 to prevent degradation of phosphors. Next, the light emitting device package 100 illustrated in FIGS. 5 and 6 may be manufactured by cutting the resulting structure into individual light emitting device package units by using a blade D.

FIGS. 24 to 30 are cross-sectional views illustrating a method of manufacturing a light emitting device package according to an embodiment.

Particularly, FIGS. 24 to 30 describe a method of manufacturing the light emitting device package of FIGS. 10A and 12A.

Figure 24:
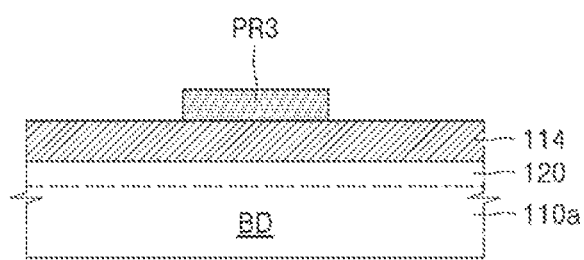
FIGS. 24 to 30 are cross-sectional views illustrating a method of manufacturing a light emitting device package according to an embodiment.
Figure 25:
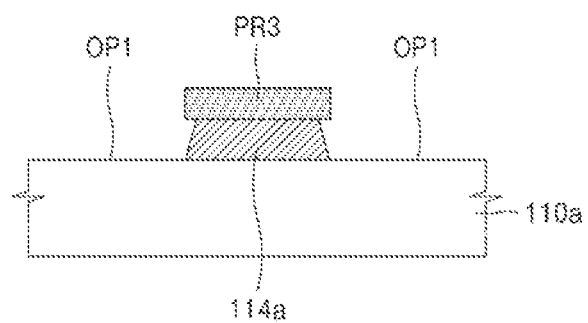

Referring to FIGS. 24 and 25, as illustrated in FIG. 24, a mask material layer 114 may be formed on a substrate 110a. The material constituting the substrate 110a has been described above and thus will not be described herein. As described above, the substrate 110a may include a body layer BD doped with high-concentration impurities and a low-concentration impurity layer 120 doped with lower-concentration impurities than the body layer BD.

The substrate 110a may include the body layer BD doped with high-concentration impurities and the low-concentration impurity layer 120 selectively when necessary. Subsequently, a photoresist pattern PR3 may be formed on a partial region of the mask material layer 114. The photoresist pattern PR3 may be formed by using a photolithography process.

As illustrated in FIG. 25, a mask layer 114a may be formed by etching the mask material layer 114 by using the photoresist pattern PR3 as an etch mask. The mask layer 114a may be formed such that a top portion is narrower than a bottom portion thereof, as shown in FIG. 25. Accordingly, one sidewall of the mask layer 114a may be inclined. According to the formation of the mask layer 114a, a first exposure region OP1 may be formed on a portion of the substrate 110a except the mask layer 114a. The photoresist pattern PR3 may be removed after the formation of the mask layer 114a.

Figure 26:
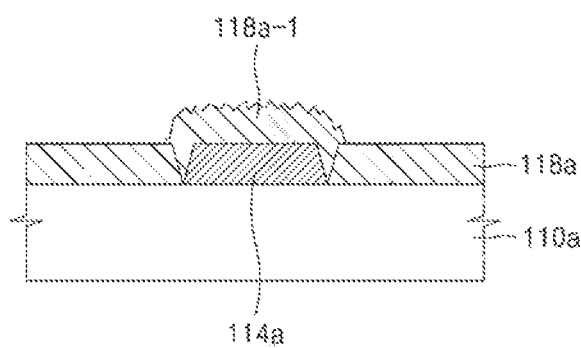
Figure 27:
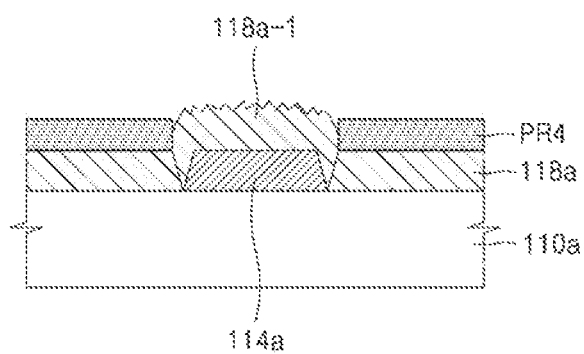

Referring to FIGS. 26 and 27, as illustrated in FIG. 26, a buffer layer 118a and a sacrificial buffer layer 118a-1 may be formed on the mask layer 114a and the first exposure region OP1 (see FIG. 25) of the substrate 110a. The buffer layer 118a may be formed of AlN or AlGaN. The sacrificial buffer layer 118a-1 may be formed of amorphous or polycrystalline materials. The buffer layer 118a and the sacrificial buffer layer 118a-1 may be formed simultaneously.

As illustrated in FIG. 27, a photoresist pattern PR4 may be formed on the buffer layer 118a on the first exposure region OP1. The photoresist pattern PR4 may be formed by using a photolithography process.

Figure 28:
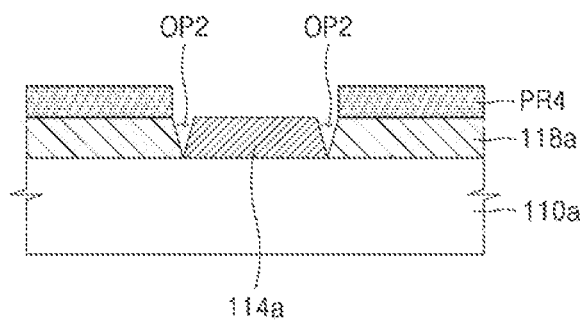
Figure 29:
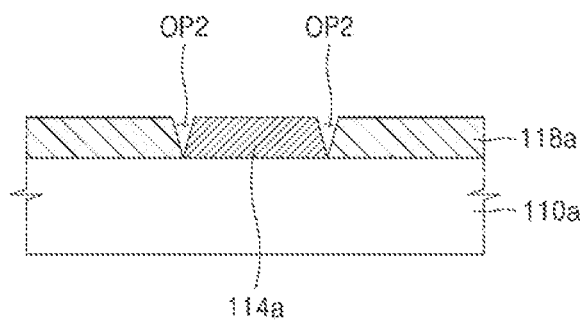

Referring to FIGS. 28 and 29, as illustrated in FIG. 28, the amorphous or polycrystalline sacrificial buffer layer 118a-1 may be dry-etched by using the photoresist pattern PR4 as an etch mask. In this case, a second exposure region OP2 may be formed between the mask layer 114a and the buffer layer 118a. The second exposure region OP2 may be formed in the process of forming the mask layer 114a and the buffer layer 118a and the process of removing the sacrificial buffer layer 118a-1. Subsequently, the photoresist pattern PR4 may be removed as illustrated in FIG. 29.

Figure 30:
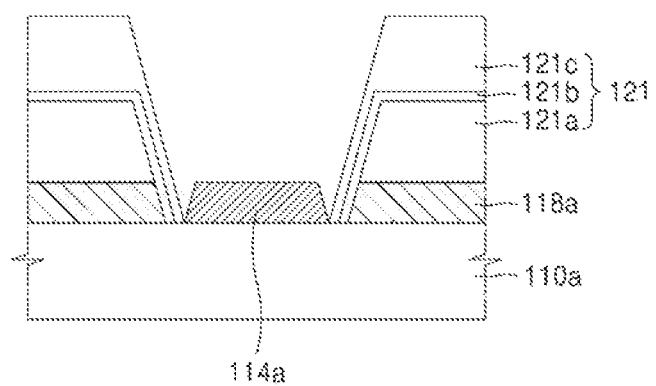

Referring to FIG. 30, a light emitting structure 121 may be formed on the substrate 110a on which the mask layer 114a and the buffer layer 118a are formed. The light emitting structure 121 may constitute a semiconductor light emitting unit. The light emitting structure 121 may include a first conductivity type semiconductor layer 121a formed on the buffer layer 118a, and an active layer 121b and a second conductivity type semiconductor layer 121c sequentially formed on the sidewall and surface of the buffer layer 118a and the first conductivity type semiconductor layer 121a.

Since the light emitting structure 121 is formed before the mask layer 114a is removed, the active layer 121b and the second conductivity type semiconductor layer 121c may be formed on the sidewall of the first conductivity type semiconductor layer 121a or the buffer layer 118a. Since one sidewall of the buffer layer 118a is inclined, one sidewall of the light emitting structure 121 may also be inclined upward.

Subsequently, the mask layer 114a of FIG. 30 may be removed. Since the mask layer 114a is removed after the light emitting structure 121 is formed, the surface defect or damage of the substrate 110a may be suppressed. In other words, the mask layer 114a may be a protection layer for protecting the substrate 110a when the light emitting structure 121 is formed.

Subsequently, as described above, a switching unit may be reliably formed on the substrate 110a with suppressed surface defects. Subsequently, a light emitting window may be formed at the substrate 110a corresponding to the light emitting structure 121 and then a wavelength converting unit may be formed at the light emitting window to complete the light emitting device package 400 illustrated in FIG. 10A.

Figure 31:
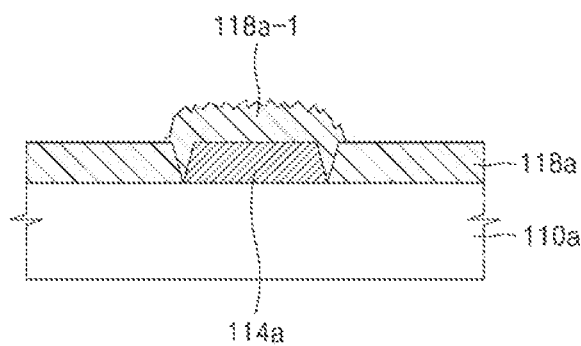
FIGS. 31 and 32 are cross-sectional views illustrating a method of manufacturing a light emitting device package according to an embodiment.
Figure 32:
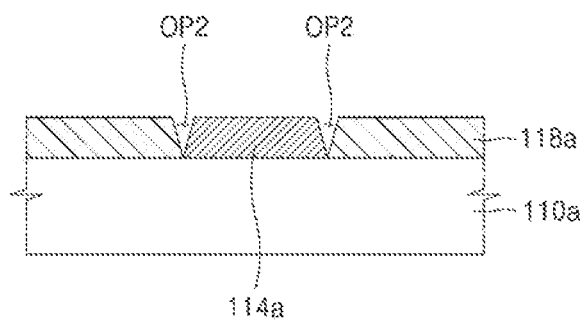

FIGS. 31 and 32 are cross-sectional views illustrating a method of manufacturing a light emitting device package according to an embodiment.

Particularly, FIGS. 31 and 32 are to describe a method of manufacturing the light emitting device package of FIGS. 10A and 12A. The manufacturing process of FIGS. 24 and 25 may be performed as described above. For convenience, a description will be again made by using FIG. 31.

Referring to FIG. 31, a buffer layer 118a and a sacrificial buffer layer 118a-1 may be formed on a mask layer 114a and a first exposure region OP1 (see FIG. 25) of a substrate 110a. The buffer layer 118a may be formed of AlN or AlGaN. The sacrificial buffer layer 118a-1 may be formed of amorphous or polycrystalline materials. The buffer layer 118a and the sacrificial buffer layer 118a-1 may be formed simultaneously.

Referring to FIG. 32, the amorphous or polycrystalline sacrificial buffer layer 118a-1 (see FIG. 31) may be removed by a wet etching process. The sacrificial buffer layer 118a-1 may be removed by using $H_3PO_4$, KOH, or $NH_4OH$ solution. In this case, a second exposure region OP2 may be formed between the mask layer 114a and the buffer layer 118a. The second exposure region OP2 may be formed in the process of forming the mask layer 114a and the buffer layer 118a and the process of removing the sacrificial buffer layer 118a-1.

Subsequently, a light emitting structure 121 may be formed on the substrate 110a on which the mask layer 114a and the buffer layer 118a are formed as illustrated in FIG. 30. Subsequently, the mask layer 114a of FIG. 30 may be removed. A switching unit may be formed on the substrate 110a as described above. Subsequently, a light emitting window may be formed at the substrate 110a corresponding to the light emitting structure 121 and then a wavelength converting unit may be formed at the light emitting window to complete the light emitting device package 400 illustrated in FIG. 10A.

FIGS. 33 to 36 are cross-sectional views illustrating a method of manufacturing a light emitting device package according to an embodiment.

Particularly, FIGS. 33 to 36 describe a method of manufacturing the light emitting device package of FIGS. 11A and 12B, according to an embodiment.

Figure 33:
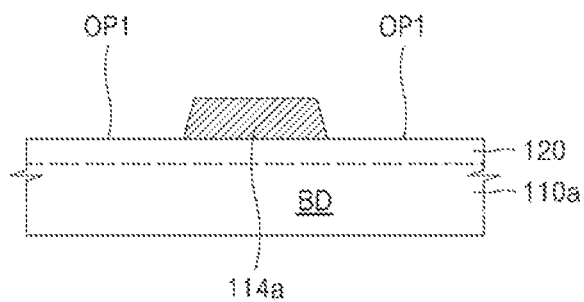
FIGS. 33 to 36 are cross-sectional views illustrating a method of manufacturing a light emitting device package according to an embodiment.

Referring to FIG. 33, the manufacturing operations of FIGS. 24 and 25 may be performed. In this case, a mask layer 114a may be formed on a substrate 110a as illustrated in FIG. 33. The substrate 110a may include a body layer BD doped with high-concentration impurities and a low-concentration impurity layer 120 doped with lower-concentration impurities than the body layer BD. The mask layer 114a may be formed such that a top portion is narrower than a bottom portion thereof. Accordingly, one sidewall of the mask layer 114a may be inclined. According to the formation of the mask layer 114a, a first exposure region OP1 may be formed on a portion of the substrate 110a except the mask layer 114a.

Figure 34:
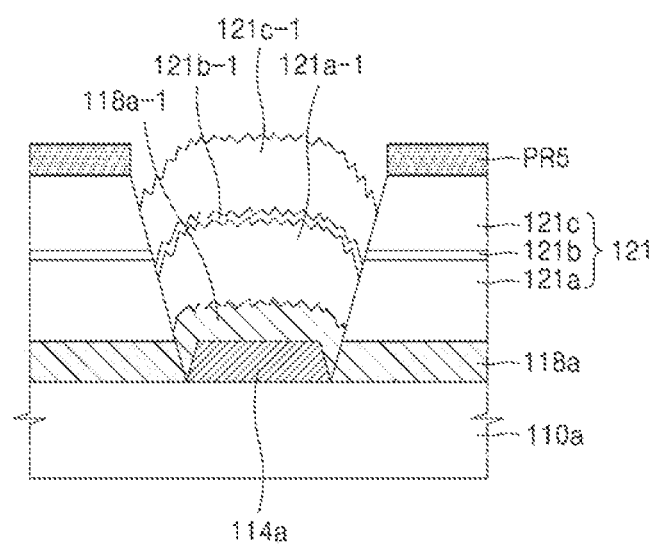

Referring to FIG. 34, a buffer layer 118a and a sacrificial buffer layer 118a-1 may be formed on the mask layer 114a and a first exposure region OP1 (see FIG. 33) of the substrate 110a. The buffer layer 118a may be formed of AlN or AlGaN. The sacrificial buffer layer 118a-1 may be formed of amorphous or polycrystalline materials. The buffer layer 118a and the sacrificial buffer layer 118a-1 may be formed simultaneously.

Next, a light emitting structure 121 may be formed on the buffer layer 118a. The light emitting structure 121 may constitute a semiconductor light emitting unit. The light emitting structure 121 may include a first conductivity type semiconductor layer 121a formed on the buffer layer 118a, and an active layer 121b and a second conductivity type semiconductor layer 121c sequentially formed on the surface of the first conductivity type semiconductor layer 121a.

A first sacrificial semiconductor layer 121a-1, a sacrificial active layer 121b-1, and a second sacrificial semiconductor layer 121c-1 may be formed on the sacrificial buffer layer 118a-1 when the light emitting structure 121 is formed. The first sacrificial semiconductor layer 121a-1, the sacrificial active layer 121b-1, and the second sacrificial semiconductor layer 121c-1 may include amorphous or polycrystalline materials. Subsequently, a photoresist pattern PR5 may be formed on the second conductivity type semiconductor layer 121c constituting the light emitting structure 121.

Figure 35:
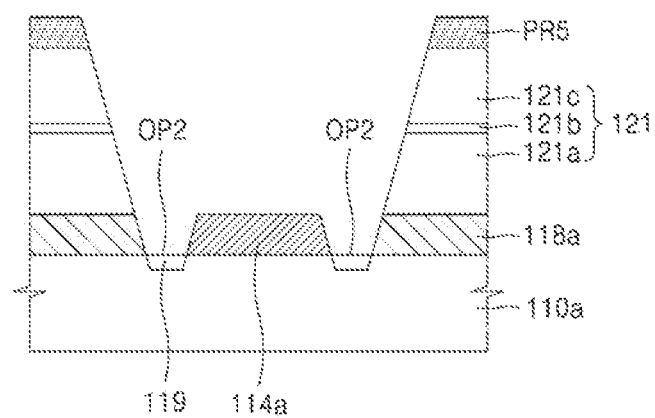

Referring to FIG. 35, the second sacrificial semiconductor layer 121c-1, the sacrificial active layer 121b-1, the first sacrificial semiconductor layer 121a-1, and the sacrificial buffer layer 118a-1 may be sequentially etched by using the photoresist pattern PR5 as an etch mask. In this case, a recess portion 119 may be formed in a second exposure region OP2 between the mask layer 114a and the buffer layer 118a.

The second exposure region OP2 and the recess portion 119 may be formed in the process of forming the mask layer 114a and the buffer layer 118a and the process of removing the second sacrificial semiconductor layer 121c-1, the sacrificial active layer 121b-1, the first sacrificial semiconductor layer 121a-1, and the sacrificial buffer layer 118a-1. The width of the photoresist pattern PR5 or the light emitting structure 121 may be reduced in the operation of forming the second exposure region OP2 and the recess portion 119. Subsequently, the photoresist pattern PR5 may be removed as illustrated in FIG. 35.

Figure 36:
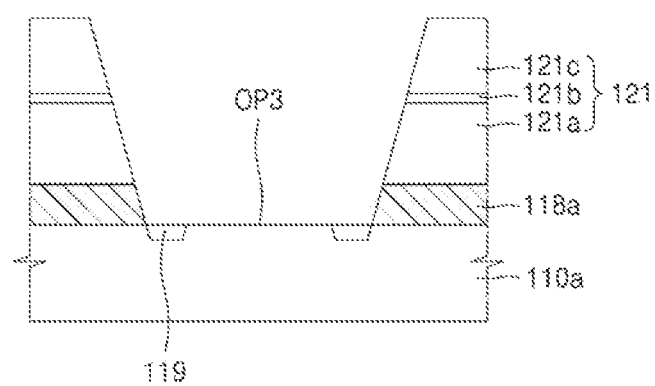

Referring to FIG. 36, the mask layer 114a of FIG. 35 may be removed. Since the mask layer 114a is removed after the light emitting structure 121 is formed, the surface defect and/or damage of the substrate 110a may be suppressed. In other words, the mask layer 114a may be a protection layer for protecting the substrate 110a when the light emitting structure 121 is formed.

Subsequently, as described above, a switching unit may be reliably formed on the substrate 110a with suppressed surface defects. Subsequently, a light emitting window may be formed at the substrate 110a corresponding to the light emitting structure 121 and then a wavelength converting unit may be formed at the light emitting window to complete a light emitting device package as illustrated in FIGS. 11A and 12B.

While various embodiments have been described above with reference to the accompanying drawings, those of ordinary skill in the art will understand that various changes or modifications may be made therein without materially departing from the scope of the inventive concept. Also, it is to be understood that the embodiments described above should be considered in a descriptive sense only and not for purposes of limitation. Thus, the spirit and scope of the inventive concept should be defined by the appended claims.

While the inventive concept has been particularly shown and described with reference to embodiments thereof, it will be understood that various changes in form and details may be made therein without departing from the spirit and scope of the following claims.

What is claimed is:

1. A light emitting device package comprising:
   a substrate having a first surface and a second surface located opposite to the first surface;
   a plurality of semiconductor light emitting units arranged spaced apart from each other on at least a portion of a horizontal extension line of the first surface of the substrate and each comprising a first conductivity type semiconductor layer, an active layer, and a second conductivity type semiconductor layer sequentially located on the first conductivity type semiconductor layer;
   a plurality of wavelength converting units corresponding respectively to the plurality of semiconductor light emitting units and arranged on the first conductivity type semiconductor layers of the plurality of semiconductor light emitting units;
   a plurality of switching units arranged spaced apart from the plurality of semiconductor light emitting units over the first surface of the substrate and electrically connected to the plurality of semiconductor light emitting units, each of the plurality of switching units comprising an exposure region exposing the first surface between adjacent ones of the plurality of semiconductor light emitting units;
   a recess portion formed in the substrate at the exposure region and having a step at the first surface of the substrate where each of the plurality of switching units is located; and
   a molding unit covering the plurality of semiconductor light emitting units and filling the recess portion.

2. The light emitting device package of claim 1, further comprising a buffer layer between the plurality of semiconductor light emitting units and the plurality of wavelength converting units.

3. The light emitting device package of claim 1, wherein the substrate comprises a semiconductor substrate comprising silicon, the substrate comprises a body layer doped with high-concentration impurities and a low-concentration impurity layer doped with lower-concentration impurities than the body layer, and the low-concentration impurity layer is located adjacent to each of the plurality of switching units.

4. The light emitting device package of claim 1, wherein the plurality of wavelength converting units are charged in through holes penetrating from the first surface to the second surface of the substrate.

* * * * *